United States Patent [19]
Aoki

[11] Patent Number: 5,877,537
[45] Date of Patent: *Mar. 2, 1999

[54] SEMICONDUCTOR DEVICE HAVING FIRST TRANSISTOR ROWS WITH SECOND TRANSISTOR ROWS CONNECTED THEREBETWEEN

[75] Inventor: Hitoshi Aoki, Kasaoka, Japan

[73] Assignee: Sharp Kabushiki Kaisha, Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 665,802

[22] Filed: Jun. 18, 1996

[30] Foreign Application Priority Data

Dec. 14, 1995 [JP] Japan .................................. 7-326057

[51] Int. Cl.⁶ .................................................. H01L 27/112
[52] U.S. Cl. ........................ 257/390; 257/330; 257/316; 257/622
[58] Field of Search .................................. 257/390, 330, 257/331, 316, 622

[56] References Cited

U.S. PATENT DOCUMENTS

| | | | |
|---|---|---|---|
| 4,989,055 | 1/1991 | Redwine | 257/390 |
| 5,258,634 | 11/1993 | Yang | 257/331 |
| 5,330,924 | 7/1994 | Huang et al. | 457/43 |
| 5,453,637 | 9/1995 | Fong-Chun et al. | 257/390 |
| 5,572,056 | 11/1996 | Hsue et al. | 257/390 |
| 5,721,698 | 2/1998 | Lee et al. | 257/390 |

FOREIGN PATENT DOCUMENTS

4(1992)-10653  1/1992  Japan .

*Primary Examiner*—David B. Hardy
*Attorney, Agent, or Firm*—Nixon & Vanderhye, P.C.

[57] ABSTRACT

A semiconductor device comprises: a plurality of first transistor rows each including a plurality of first transistors connected in series; and a plurality of second transistor rows provided between the first transistor rows and each including a plurality of second transistors; wherein a source/drain region of one first transistor in one first transistor row is connected to a source/drain region of another first transistor in another first transistor row through a second transistor.

6 Claims, 26 Drawing Sheets

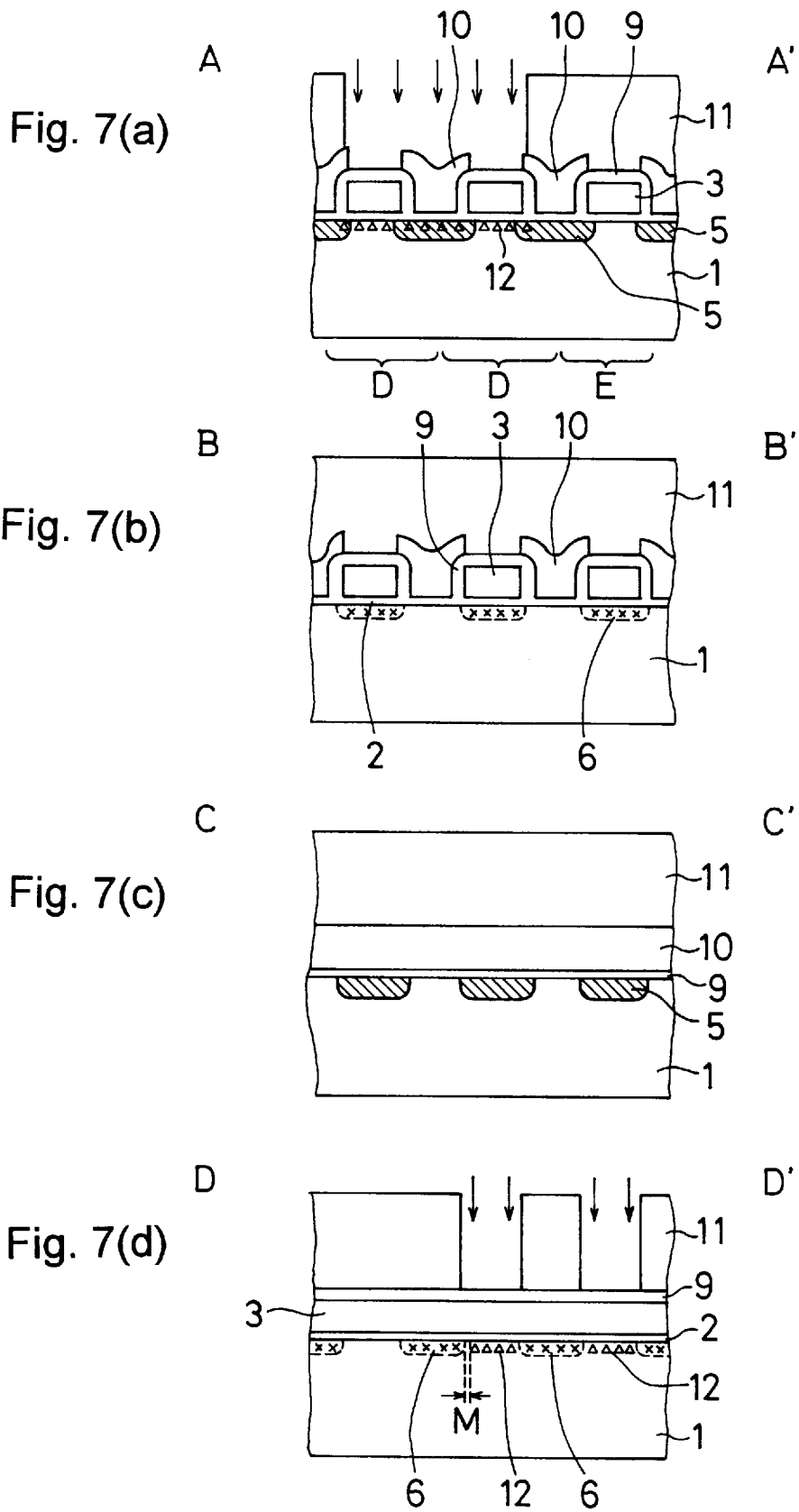

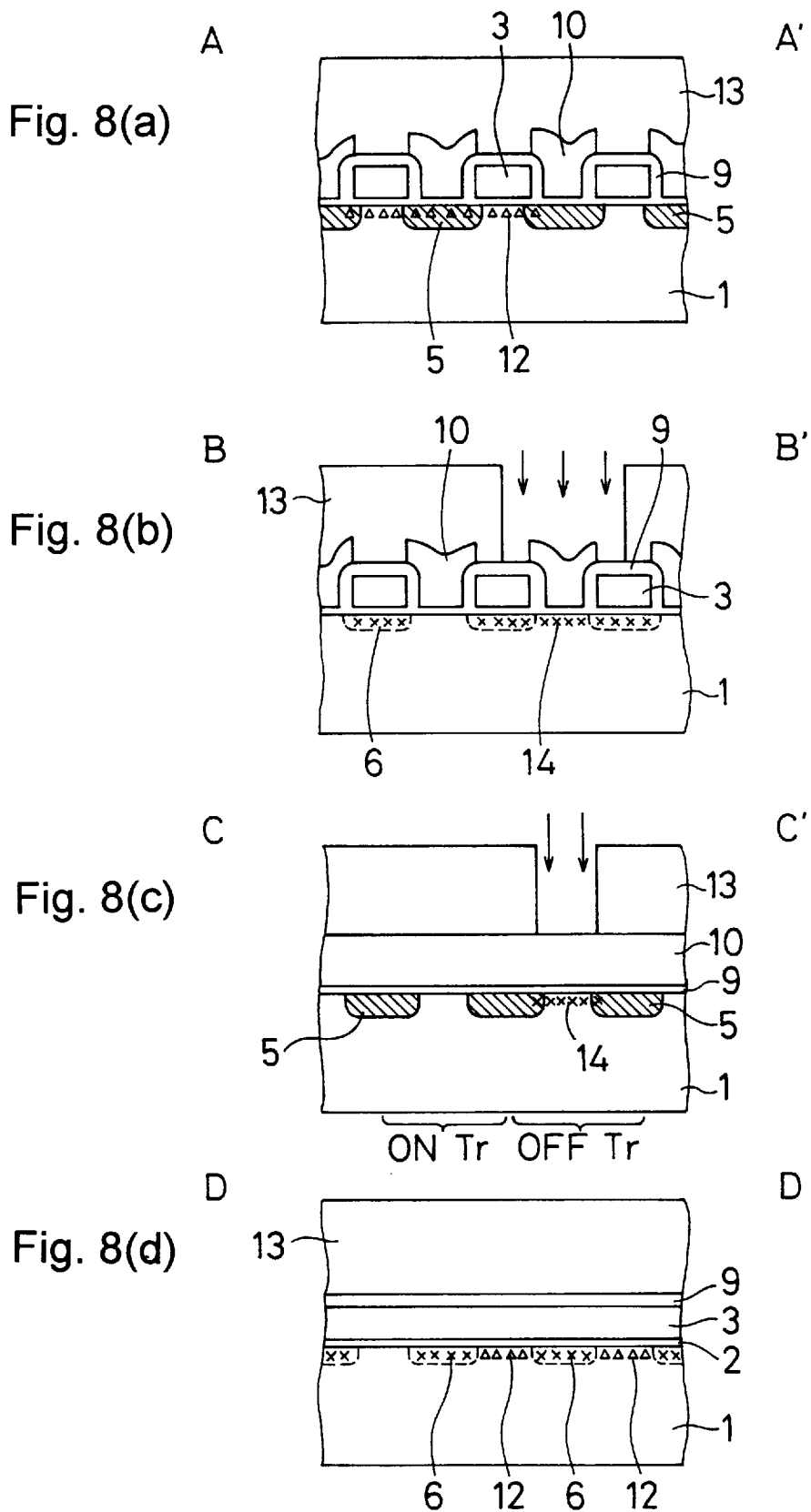

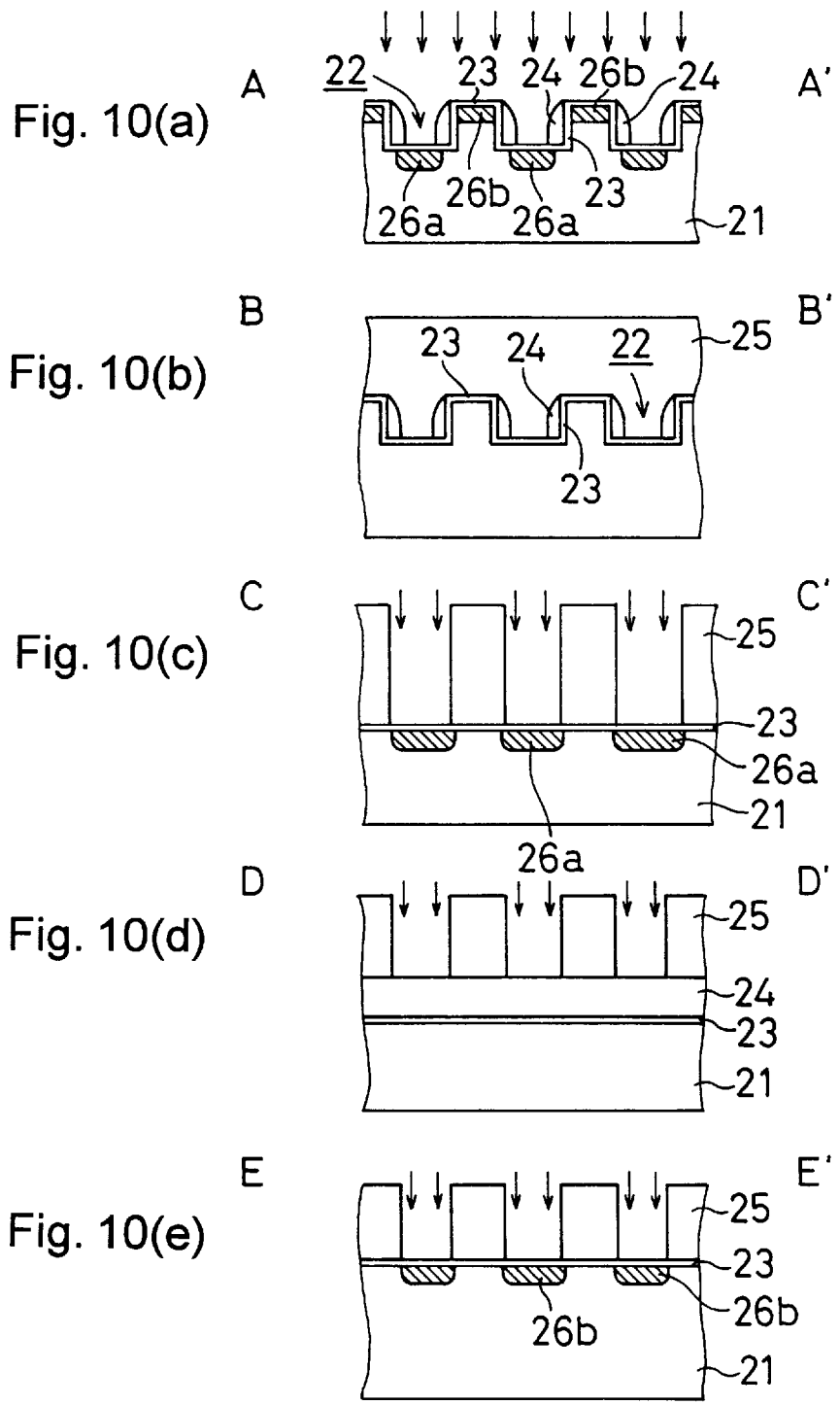

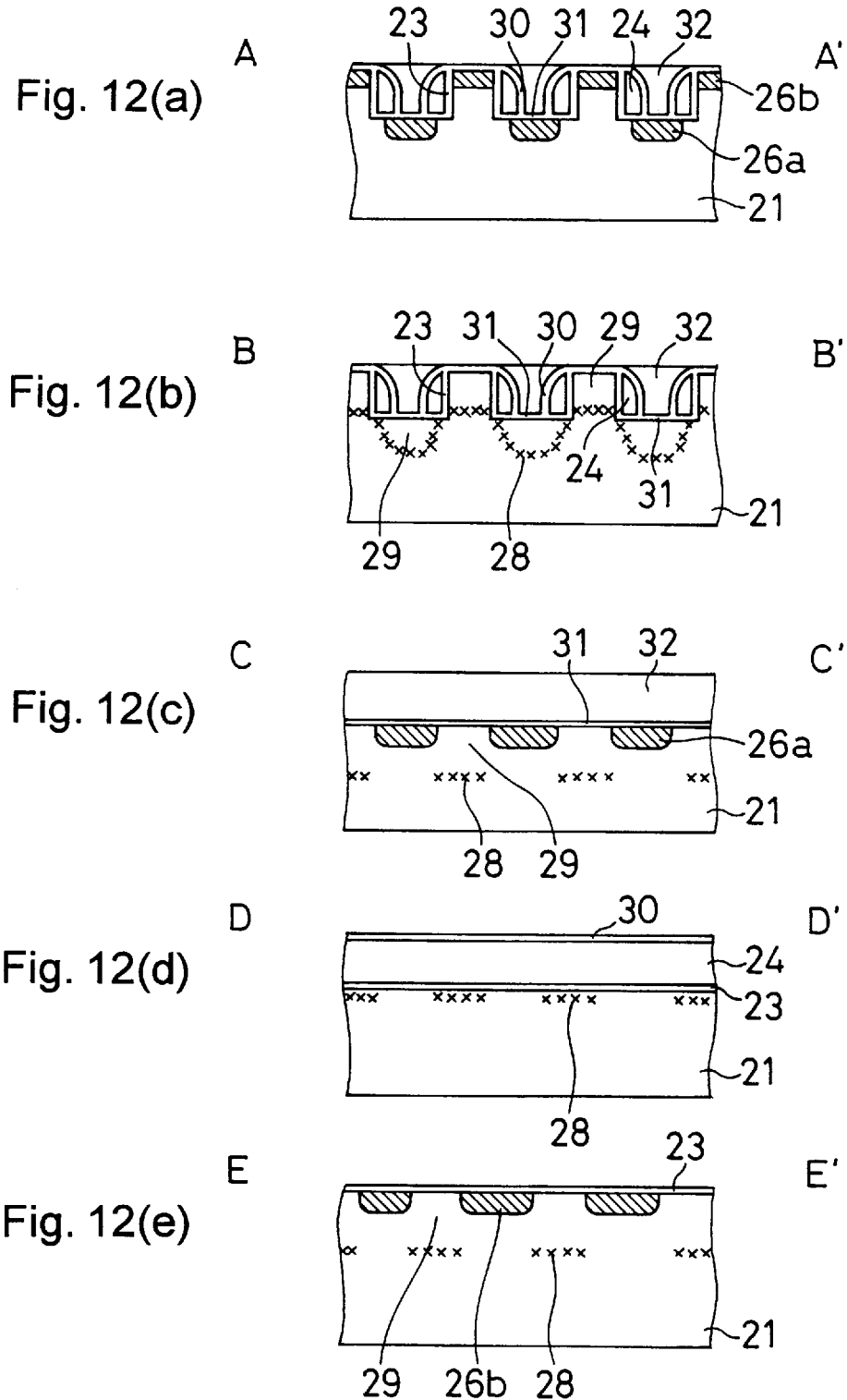

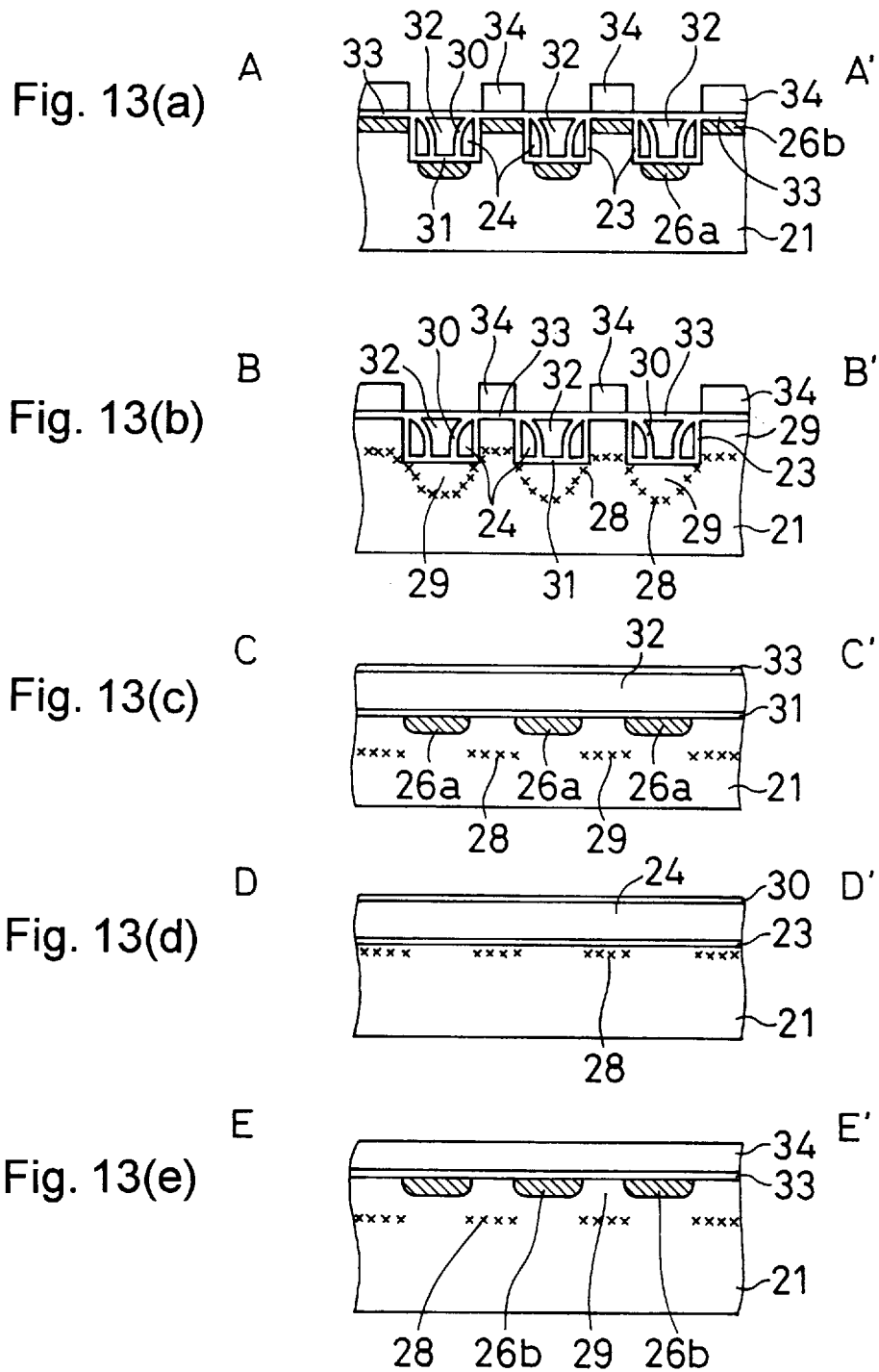

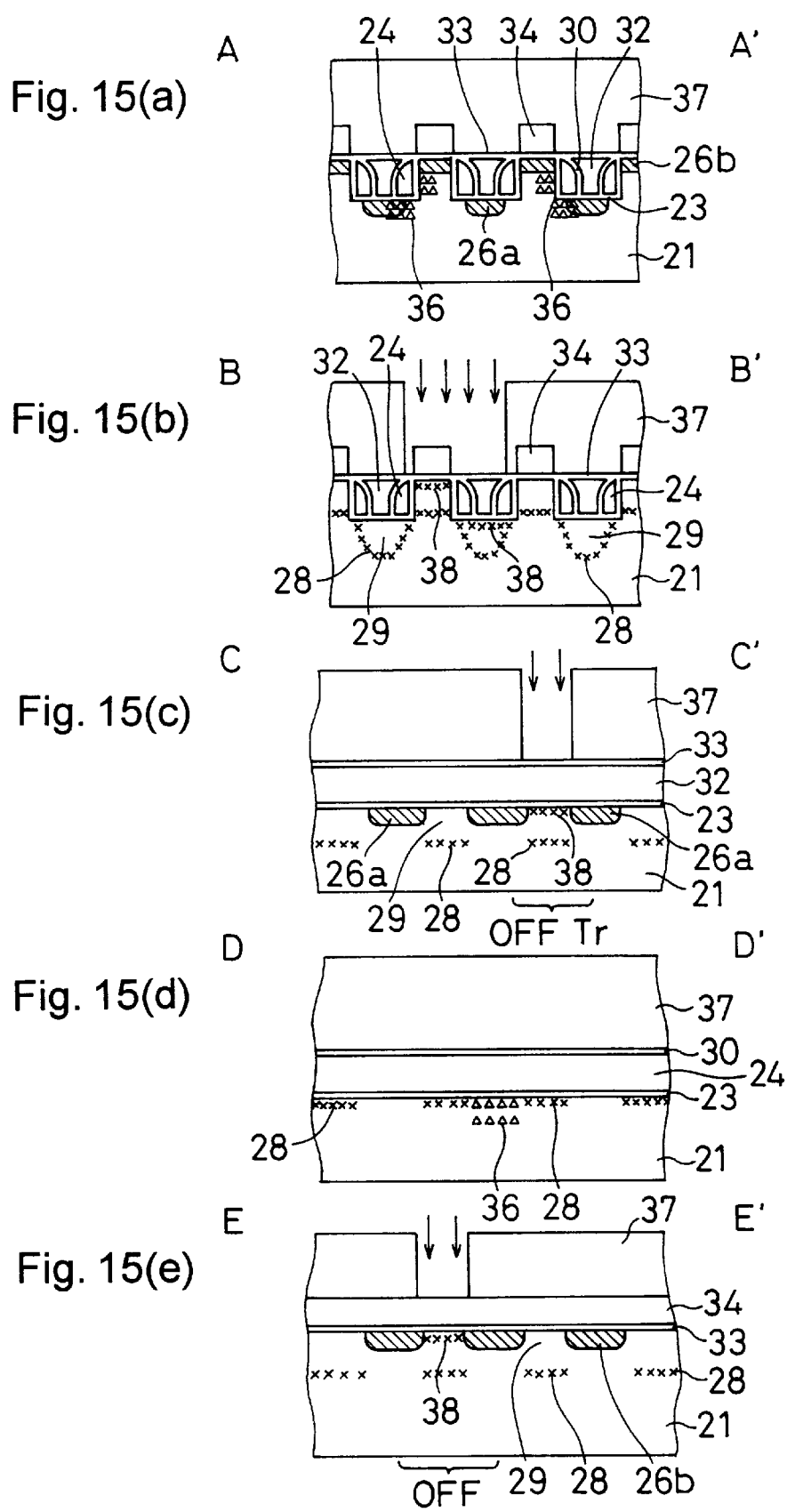

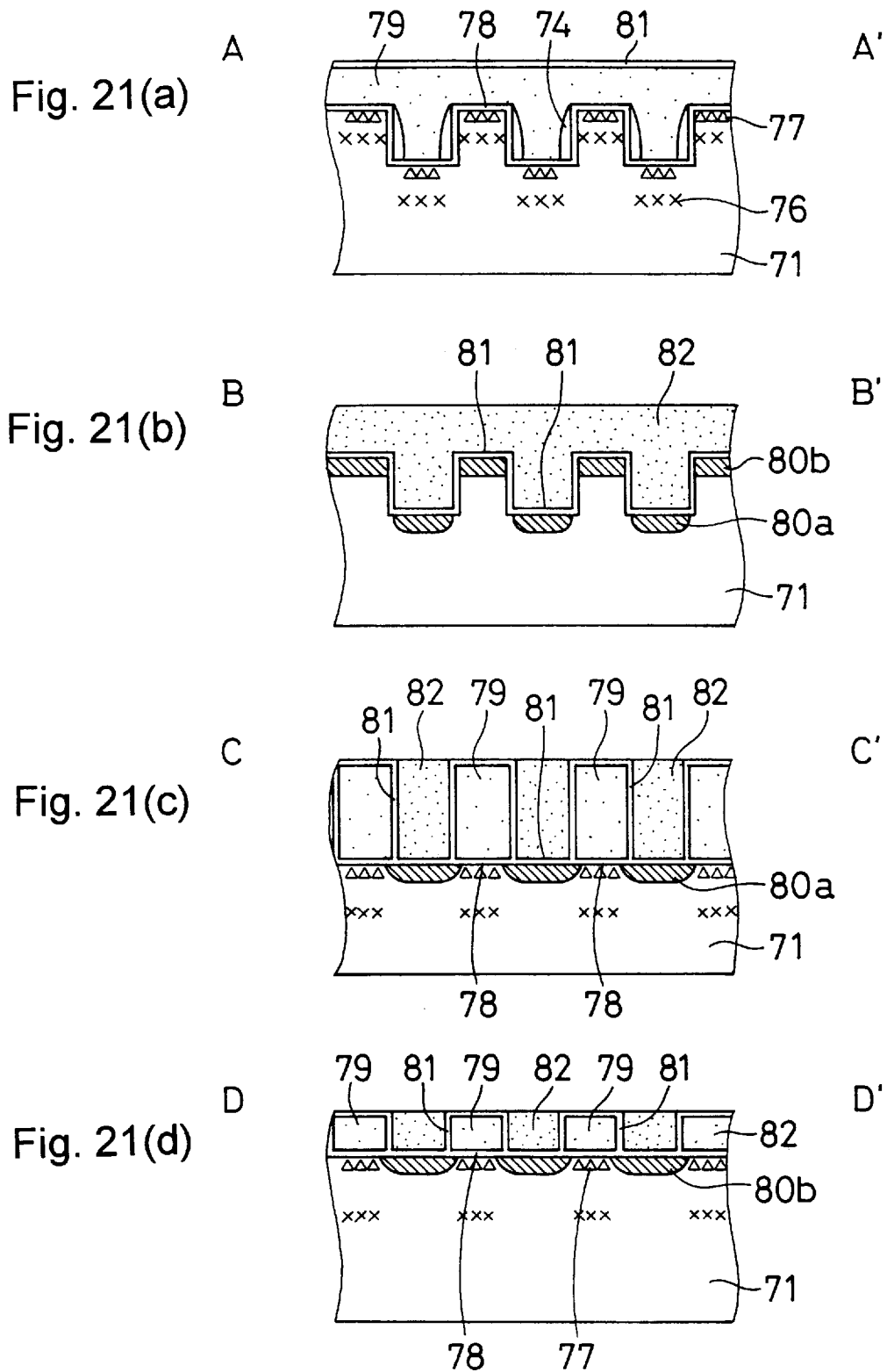

Fig. 25(a) (Prior Art)
Fig. 25(b) (Prior Art)
Fig 25(c) (Prior Art)
Fig. 25(d) (Prior Art)
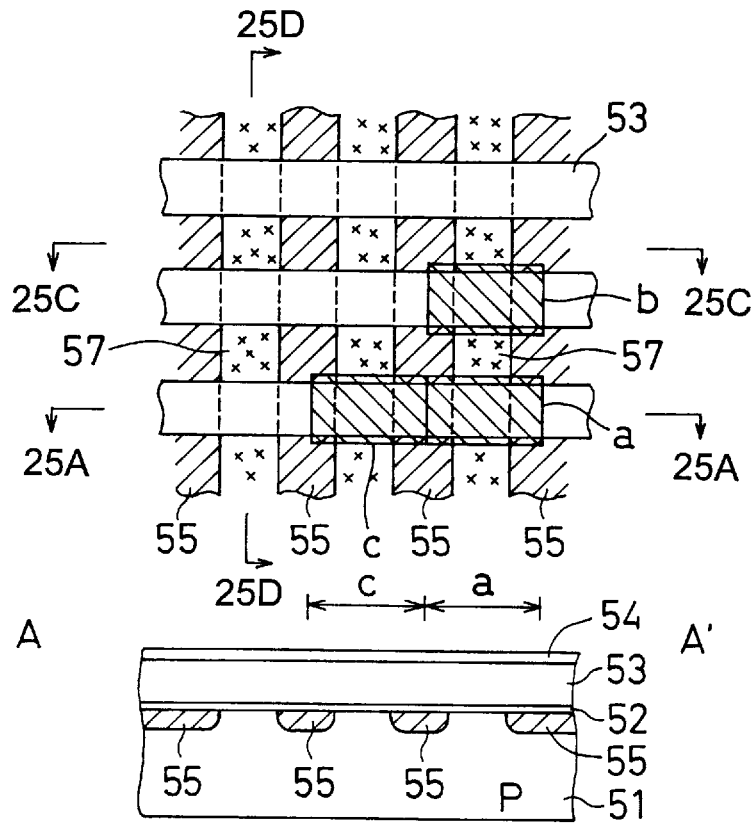
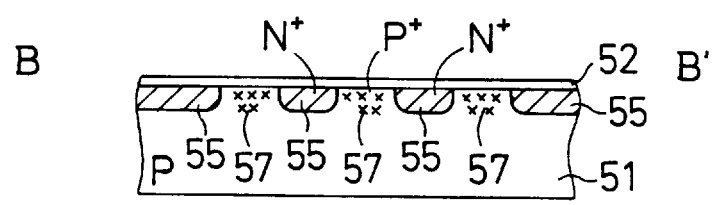
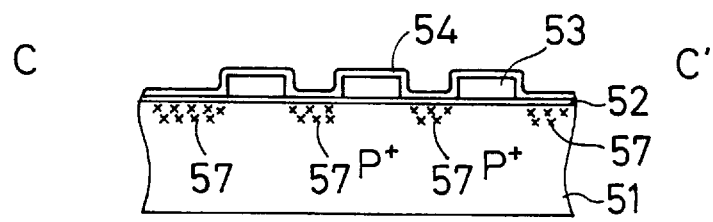

SEMICONDUCTOR DEVICE HAVING FIRST TRANSISTOR ROWS WITH SECOND TRANSISTOR ROWS CONNECTED THEREBETWEEN

BACKGROUND OF THE INVENTION

1. Field of the Invention

The present invention relates to a semiconductor device and a fabrication process therefor. More particularly, the invention relates to a semiconductor device including NAND memory cell transistors and NOR memory cell transistors formed on the same semiconductor substrate thereof and to a fabrication process therefor.

2. Description of Related Arts

A NAND ROM cell and a NOR ROM cell are typical mask ROM cells. The NAND ROM cell has a transistor row including a plurality of enhancement-type transistors and depletion-type transistors connected in series. The writing of ROM data in the NAND ROM cell is achieved by suitably arranging the enhancement-type transistors and the depletion-type transistors in the transistor row in accordance with the ROM data to be written therein. The NOR ROM cell has a transistor row including a plurality of cell transistors connected in parallel to a bit line. The writing of ROM data in the NOR ROM cell is achieved by selectively setting the threshold voltages of the transistors in the transistor row to a voltage higher than a supply voltage in accordance with the ROM data to be written therein.

In general, the NAND ROM is excellent in integration level but unsatisfactory in operating speed, while the NOR ROM is excellent in operating speed but unsatisfactory in integration level.

More specifically, the conventional NOR ROM cell requires one contact hole for every two memory cell transistors for interconnection. Therefore, a mask alignment margin should be provided for the formation of a contact hole region and a contact hole. This makes it very difficult to reduce the size of the memory cell.

To increase the integration level, NAND ROM cells have been widely used. In a NAND ROM, as described above, a plurality of cell transistors are connected in series in a transistor row, and contact holes are provided at opposite ends of the transistor row. Therefore, the integration level can be increased by connecting a greater number of cell transistors in series.

To meet a recent demand for higher density integration of memory cells, attempts have been made to reduce the dimensions of a device isolation region and a level difference in the NAND ROM.

For example, a higher density NOR ROM cell is proposed in which device isolation is achieved without the provision of a device isolation film and which has advantages of both the NAND ROM and the NOR ROM.

In the memory cell, as shown in FIG. 25(a) to FIG. 25(d) a plurality of high concentration diffusion layers 55 which are to be formed into source/drain regions and bit lines are formed in a parallel relation in a memory cell formation region of a semiconductor substrate 51, and a plurality of gate electrodes (word lines) 53 extending perpendicular to the high concentration diffusion layers 55 for the bit lines are formed on the semiconductor substrate 51 with intervention of an insulating film 52. Impurity ions having a conductivity type different from that of the source/drain regions are implanted into regions 57 not formed with the gate electrodes 53 and the high concentration diffusion layers 55. The regions 57 serve for device isolation between cell transistors a and b.

Since the memory cells having such a construction are not provided with a device isolation film such as a LOCOS film, the surface of the semiconductor substrate 51 is flat. Therefore, the gate electrodes 53 can be provided at intervals smaller than a usual workability limit for the formation of gate electrodes. The ion implantation into the device isolation regions 57 can be achieved in a self-alignment manner by using the gate electrodes 53 as a mask. Thus, this construction is effective for higher density integration of the memory cells.

To meet an increasing demand for higher capacity semiconductor devices, various attempts have been made for higher density integration.

For example, Japanese Unexamined Patent Publication No. Hei 4(1992)-10653 proposes a semiconductor device in which NOR ROM cells are formed in a staggered manner with an elevation difference as shown in FIG. 26(a) to FIG. 26(c). In a memory cell of the semiconductor device, a plurality of high concentration diffusion layers 65 which are to be formed into source/drain regions and bit lines are formed in a parallel relation in a memory cell formation region of a semiconductor substrate 61, a plurality of first-layer gate electrodes (word lines) 63 extending perpendicular to the high concentration diffusion layers 65 are provided on the semiconductor substrate 61 with intervention of a gate insulating film 62. A plurality of second-layer gate electrodes 64 extending parallel to the first-layer gate electrodes 63 are provided between the first-layer gate electrodes 63 with intervention of an insulating film 67.

In the semiconductor device having such a construction, a transistor a having a first-layer gate electrode 63 and high concentration diffusion layers 65 and 65 is directly connected to a transistor b having a second-layer gate electrode 64 and the high concentration diffusion layers 65 and 65. Therefore, the effective gate width of a transistor varies depending on whether ROM data is written in a transistor adjacent thereto. More specifically, where ROM data are written in the transistors b1 and b2 in FIG. 26(a), the gate width W1 of a transistor between the transistors b1 and b2 is the narrowest, the width W2 of a transistor adjoining only the transistor b1 or b2 is the second narrowest, and the width W3 of a transistor adjoining neither the transistor b1 nor the transistor b2 is the greatest. Thus, there are at least three gate widths. The variation in the gate width adversely affects the transistor characteristics of the memory cells.

SUMMARY OF THE INVENTION

In accordance with a first aspect of the present invention, there is provided a first semiconductor device comprising: a plurality of first transistor rows each including a plurality of first transistors connected in series; and a plurality of second transistor rows provided between the first transistor rows and each including a plurality of second transistors; wherein a source/drain region of one first transistor in one first transistor row is connected to a source/drain region of another first transistor in another first transistor row through a second transistor in the second transistor row.

In accordance with a second aspect of the present invention, there is provided a second semiconductor device comprising: a plurality of first word lines disposed on a semiconductor substrate with intervention of a first gate insulating film and extending parallel to each other in a first direction; a plurality of first transistors each having a gate electrode connected to a corresponding one of the first word lines; a plurality of second word lines disposed between the first word lines with intervention of a second insulating film and extending in the first direction; a plurality of second transistors each having a gate electrode connected to a corresponding one of the second word lines; wherein the first transistors each share a source/drain region of an adjacent first transistor juxtaposed thereto in a second direction perpendicular to the first direction, and the second transistors each share a source/drain region of an adjacent second transistor juxtaposed thereto in the first direction; and the source/drain regions of the first transistors are formed in the semiconductor substrate below the second word lines, and the first transistors each share a source/drain region of an adjacent second transistor.

In accordance with a third aspect of the present invention, there is provided a first process for fabricating a semiconductor device, comprising the steps of: (i-a) providing a plurality of first word lines extending parallel to each other in a first direction on a semiconductor substrate with intervention of a first gate insulating film; (ii-a) forming a resist pattern including a plurality of pattern lines extending perpendicular to the first word lines, and implanting ions into the semiconductor substrate by using the resist pattern and the first word lines as a mask to form source/drain regions, whereby a plurality of first transistors are formed which each share a source/drain region of an adjacent first transistor juxtaposed thereto in a second direction perpendicular to the first direction; and (iii-a) forming a plurality of second word lines between the first word lines on the source/drain regions with intervention of a second insulating film, whereby a plurality of second transistors are formed which each share source/drain regions of adjacent first transistors juxtaposed thereto in the first direction.

In accordance with a fourth aspect of the present invention, there is provided a second process for fabricating a semiconductor device, comprising the steps of: (i-b) forming a plurality of trenches extending parallel to each other in a first direction in a semiconductor substrate, and forming a plurality of first word lines extending parallel to each other on side walls of the respective trenches, or on top face portions of the semiconductor substrate between the trenches and on bottoms of the trenches, with intervention of a first insulating film; (ii-b) forming a resist pattern including a plurality of pattern lines extending perpendicular to the first word lines, and implanting ions into the semiconductor substrate by using the resist pattern and the first word lines as a mask to form source/drain regions in upper surface portions of the substrate between the trenches and in trench bottom portions of the substrate, or in trench sidewall portions of the substrate, whereby a plurality of first transistors are formed which each share source/drain regions arranged in a second direction perpendicular to the first direction and formed in an upper surface portion of the substrate between adjacent trenches and in a trench bottom portion of the substrate, or in trench sidewall portions of the substrate; and (iii-b) forming a plurality of second word lines extending parallel to each other between the first word lines on the source/drain regions with intervention of a second insulating film, whereby a plurality of second transistors are formed which each share source/drain regions of adjacent first transistors juxtaposed thereto in the first direction.

In accordance with a fifth aspect of the present invention, there is provided a third process for fabricating a semiconductor device, comprising the steps of: (i-c) forming a plurality of trenches extending parallel to each other in a second direction in a semiconductor substrate, and forming a plurality of first word lines extending parallel to each other in a first direction perpendicular to the second direction on the resulting semiconductor substrate including the trenches with intervention of a first insulating film; (ii-c) implanting ions into the semiconductor substrate by using at least the first word lines as a mask to form source/drain regions in upper surface portions of the substrate between the trenches and in trench bottom portions of the substrate, or in trench sidewall portions of the substrate, whereby a plurality of first transistors are formed which each share source/drain regions arranged in the second direction and formed in an upper surface portion of the substrate between adjacent trenches and in a trench bottom portion of the substrate, or in trench sidewall portions of the substrate; and (iii-c) forming a plurality of second word lines extending parallel to each other between the first word lines on the source/drain regions with intervention of a second gate insulating film, whereby a plurality of second transistors are formed which each share source/drain regions of adjacent first transistors juxtaposed thereto in the first direction.

BRIEF DESCRIPTION OF THE DRAWINGS

FIG. 7(a) to FIG. 7(d) are schematic sectional views taken along lines A–A', B–B', C–C' and D–D', respectively, in FIG. 2 for explaining the fabrication process;

FIG. 8(a) to FIG. 8(d) are schematic sectional views taken along lines A–A', B–B', C–C' and D–D', respectively, in FIG. 2 for explaining the fabrication process;

FIG. 10(a) to FIG. 10(e) are schematic sectional views taken along lines A–A', B–B', C–C', D–D' and E–E', respectively, in FIG. 9 for explaining a fabrication process for the semiconductor device;

FIG. 12(a) to FIG. 12(e) are schematic sectional views taken along lines A–A', B–B', C–C', D–D' and E–E', respectively, in FIG. 9 for explaining the fabrication process;

FIG. 13(a) to FIG. 13(e) are schematic sectional views taken along lines A–A', B–B', C–C', D–D' and E–E', respectively, in FIG. 9 for explaining the fabrication process;

FIG. 15(a) to FIG. 15(e) are schematic sectional views taken along lines A–A', B–B', C–C', D–D' and E–E', respectively, in FIG. 9 for explaining the fabrication process;

FIG. 21(a) to FIG. 21(d) are schematic sectional views taken along lines A–A', B–B', C–C' and D–D', respectively, in FIG. 16 for explaining the fabrication process;

FIG. 25(a) is a plan view illustrating a conventional mask ROM cell, and FIG. 25(b) to FIG. 25(d) are schematic sectional views taken along lines A–A', B–B' and C–C', respectively, in FIG. 25(a)

DETAILED DESCRIPTION OF THE PREFERRED EMBODIMENTS

Figure 1:
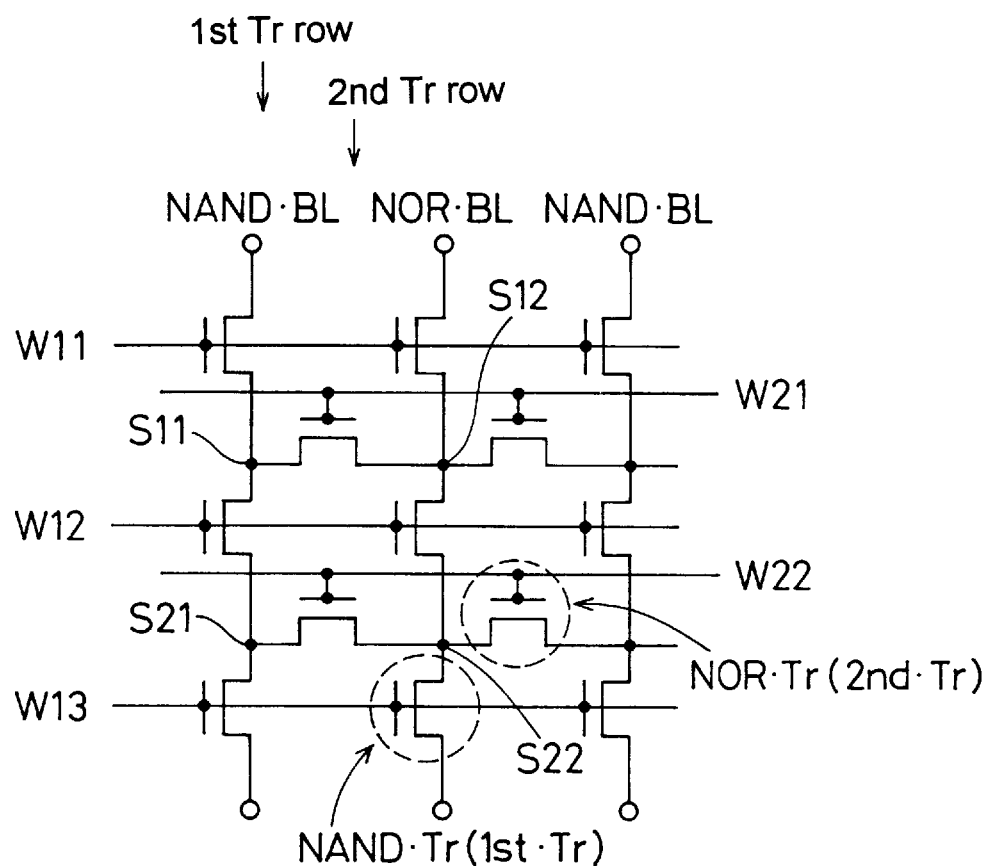
FIG. 1 is an equivalent circuit diagram of a semiconductor device according to the present invention.

The first semiconductor device of the present invention includes a plurality of first transistor rows each including a plurality of first transistors connected in series, and a plurality of second transistor rows each including a plurality of second transistors and provided between the first transistor rows. A first transistor in one first transistor row and another first transistor in another first transistor row respectively share source/drain regions of a second transistor in a second transistor row, which is connected in parallel to said one first transistor and said another first transistor. Said one first transistor row and said another first transistor row are preferably disposed adjacent to each other, but may be apart from each other with one or more first transistor rows interposed therebetween. In other words, it is not necessarily required to dispose each of the second transistor rows between every two adjacent first transistor rows, but every two adjacent second transistor rows may be apart from each other with two or more first transistor rows interposed therebetween. Further, second transistors in one second transistor row are preferably disposed in one-to-one correspondence to first transistors in one first transistor row, but the respective second transistors may be disposed such that one second transistor corresponds to two or more first transistors. Although it is the most preferable in terms of high density integration that the first transistor rows and the second transistor rows are disposed in an alternate relation so that the first transistors in the respective first transistor rows and the second transistors in the respective second transistor rows are regularly arranged in a matrix in the first semiconductor device, the first semiconductor device may be constructed such that some of the first or second transistors or some of the first or second transistor rows are absent.

The first semiconductor device according to the present invention includes the first transistors constituting NAND memory cells and the second transistors constituting NOR memory cells, so that a higher density memory can be realized. The semiconductor device can be applied to mask ROMs or nonvolatile memories including programmable ROMs such as EPROMs and EEPROMs which utilize floating gate transistors.

One modification of the first semiconductor device is a semiconductor device (hereinafter referred to as "second semiconductor device") which comprises: a plurality of word lines formed on a generally flat semiconductor substrate with intervention of a first gate insulating film and extending in a first direction; a plurality of second word lines formed between the first word lines with intervention of a second insulating film; a plurality of first transistors each having a gate electrode connected to a corresponding one of the first word lines; and a plurality of second transistors each having a gate electrode connected to a corresponding one of the second word lines.

In the second semiconductor device, the first transistors connected to the first word lines each share a source/drain region of an adjacent first transistor juxtaposed thereto in a second direction perpendicular to the first direction, whereby first transistors arranged in the second direction are connected in series. The second transistors connected to the second word lines each share a source/drain region of an adjacent second transistor juxtaposed thereto in the first direction. The first transistors each share a source/drain region of an adjacent second transistor. With this arrangement, each transistor shares a source/drain region of an adjacent transistor juxtaposed thereto in the first direction (a transversely adjacent transistor) and an adjacent transistor juxtaposed thereto in the second direction (a longitudinally adjacent transistor) for higher density integration.

In the second semiconductor device, side walls of trenches formed in the semiconductor substrate may be utilized for the formation of the first and second transistors for higher density integration.

Where the trenches extend in the first direction, i.e., the same direction in which the first and second word lines extend, the semiconductor device may have: (a) a construction such that the first word lines are formed in a sidewall-spacer-like configuration on opposite side walls of the trenches, and the second word lines are formed on top face portions of the semiconductor substrate between the respective trenches and on bottoms of the trenches whereby the first transistors each have a channel region formed in a trench sidewall portion of the substrate and source/drain regions respectively formed in a trench bottom portion of the substrate and in an upper surface portion of the substrate between adjacent trenches, and the second transistors each have a channel region and source/drain regions formed in a trench bottom portion of the substrate or in an upper surface portion of the substrate; or (b) a construction such that the second word lines are formed in a sidewall-spacer-like configuration on the opposite side walls of the trenches, and the first word lines are formed on the top face portions of the semiconductor substrate between the respective trenches and on the bottoms of the trenches whereby the first transistors each have a channel region formed in a trench bottom portion of the substrate or in an upper surface portion of the substrate and source/drain regions formed in trench sidewall portions of the substrate, and the second transistors each have a channel region and source/drain regions formed in trench sidewall portions of the substrate.

Where the trenches extend in the second direction, i.e., in the direction perpendicular to the first and second word lines, the first and second word lines extend across the trenches so that parts of the trenches are filled therewith. Thus, the semiconductor device may have: (c) a construction such that the first transistors each have a channel region and source/drain regions formed in an upper surface portion of the substrate between adjacent trenches and/or in a trench bottom portion of the substrate, and the second transistors each have a channel region formed in a trench sidewall portion of the substrate and source/drain regions formed in an upper surface portion of the substrate between adjacent trenches and in a trench bottom portion of the substrate; or (d) a construction such that the first transistors each have a channel region and source/drain regions formed in trench sidewall portions of the substrate, and the second transistors each have a channel region formed in an upper surface portion of the substrate between adjacent trenches and/or in a trench bottom portion of the substrate and source/drain regions formed in opposite trench sidewall portions of the substrate. Among these constructions, the constructions (a) and (c) are preferred in consideration of the facilitation of the formation of the source/drain regions.

The semiconductor device may comprise transistors of floating gate type respectively having floating gates formed just above channel regions thereof below the first and second word lines, which transistors serve as the first and/or second transistors. In such a case, a tunnel oxide film having a thickness smaller than an ordinary gate insulating film is preferably formed below the floating gates. Further, an ordinary gate insulating film or an insulating film having a thickness slightly greater than the ordinary gate insulating film is preferably formed between the floating gates and the first and second word lines. Both the first transistors and the second transistors are preferably formed as the transistors of floating gate type, but either the first transistors or the second transistors may be formed as the transistors of floating gate type depending on the application of the semiconductor device.

In the semiconductor device, the first transistors constitute NAND memory cells and the second transistors constitute NOR memory cells. Where the semiconductor device is a mask ROM, for example, the first transistors constructed as depletion-type (D-type) transistors or enhancement-type (E-type) transistors are preferably selectively transformed into the E type or the D type in accordance with data to be written therein. The combinational use of the E-type and D-type transistors is selected in consideration of easy formation of the transistors. As long as the conduction of a transistor can be selectively determined by the level of a voltage to be applied to the gate electrode thereof, (1) depletion-type transistors having different threshold voltages may be used in combination, or (2) enhancement-type transistors having different threshold voltages may be used in combination, for example. In such a case, the threshold voltages of transistors each originally set higher may selectively be set lower for data writing, or the threshold voltages of transistors each originally set lower may selectively be set higher for data writing.

The threshold voltages of the second transistors are preferably selectively set higher than a supply voltage in accordance with data to be written therein. The threshold voltages are properly selected in consideration of easy operation and easy data reading of the transistors. As long as the conduction of a transistor can selectively be determined by the level of the threshold voltage thereof, it is not necessarily required to set the threshold voltage of the transistor higher than the supply voltage. The threshold voltages of the second transistors are preferably set higher than the threshold voltages of the first transistors.

By properly controlling the concentrations of an impurity in the channel regions of the first and second transistors, the first and second transistors are allowed to store not only binary data but also ternary or higher level data.

Where the semiconductor device is a programmable ROM, the threshold voltages of the transistors can be controlled by selectively implanting electrons into the floating gates of the transistors.

In the first process for fabricating a semiconductor device, in the step (i-a), a plurality of first word lines extending parallel to each other in a first direction are formed on a semiconductor substrate with intervention of a first gate insulating film. The first gate insulating film is preferably formed, for example, of $SiO_2$ in a thickness of about 50 Å to about 300 Å by way of thermal oxidation. The first word lines are formed of polysilicon, a suicide of a high melting-point metal, polycide or the like in a thickness of about 1,500 Å to about 3,000 Å by known forming and processing methods. The thickness of each of the first word lines is preferably reduced as much as possible for higher density integration. To reduce the gate length or the word line width as much as possible for the same channel length, sidewall spacers of an insulating film may be formed for the first word lines when source/drain regions are formed in the subsequent step. In such a case, the sidewall spacers are used as a mask when ion implantation is performed for the formation of the source/drain regions in the subsequent step.

In the step (ii-a), a resist pattern including a plurality of pattern lines extending perpendicular to the first word lines is formed. The resist pattern is preferably formed in a desired configuration having a minimum line width on the substrate by way of a known method, e.g., a photolithographic process. Ions having a conductivity type different from that of the semiconductor substrate are implanted into the substrate by using the resist pattern and the first word lines as a mask to form the source/drain regions. For example, $As^+$ ions are implanted into the substrate at an implantation energy of about 30 KeV to about 80 KeV (such that the ions do not penetrate the first word lines) in a dose of $1 \times 10^{15}$ $cm^{-2}$ to $1 \times 10^{16}$ $cm^{-2}$. Thus, first transistors are formed, each comprising the first gate insulating film, a first gate electrode and source/drain regions. The first transistors each share a source/drain region of an adjacent first transistor juxtaposed thereto in a second direction perpendicular to the first direction.

In the step (iii-a), a plurality of second word lines are formed in a parallel relation between the first word lines on the source/drain regions formed in the previous step with intervention of a second insulating film. The second insulating film and the second word lines can be formed in the same manner as the first insulation film and the first word lines. The second word lines are preferably formed in a self-alignment manner with respect to the first word lines. Therefore, a known photolithographic/etching process or a filling/etching-back process is preferably employed for the formation of the second word lines. Thus, second transistors are formed, each comprising the second insulating film, a second gate electrode and source/drain regions formed in the previous step. The second transistors each share source/ drain regions of adjacent first transistors juxtaposed thereto in the first direction.

In the fabrication process, device isolation regions are preferably formed between the respective first transistors, and/or between the respective second transistors, and between the first transistors and the second transistors for device isolation. The device isolation may precede or follow the formation of the first word lines on the semiconductor substrate or follow the formation of the first transistors. The device isolation may be achieved by forming an LOCOS film, but is preferably achieved by implanting ions having the same conductivity type as the semiconductor substrate into regions where the device isolation regions are to be formed. For example, a resist pattern having openings on the intended regions is formed by a photolithographic process after the formation of the first transistors, and then $B^+$ ions are implanted into the intended regions in a dose of about $1 \times 10^{14}$ cm$^{-2}$ to about $3 \times 10^{14}$ cm$^{-2}$ at an implantation energy of about 100 KeV to about 200 KeV from the upper side of the first word lines by using the resist pattern as a mask. At this time, portions of the first transistors to be formed into channel regions thereof should be prevented from being subjected to the ion implantation. On the other hand, portions of the second transistors to be formed into channel regions thereof are not influenced by the ion implantation because the implantation energy is so large that the ions are implanted to a great depth of the semiconductor substrate.

Further, data are written to the semiconductor device in the following steps.

In a step (iv-a), data are selectively written to the first transistors. More specifically, a resist pattern having openings only on selected first transistors is formed on the resulting semiconductor substrate, and ions having a conductivity type different from that of the semiconductor substrate are implanted into the semiconductor substrate by using the resist pattern as a mask. For example, $P^+$ ions are preferably implanted in a dose on the order of $10^{13}$ cm$^{-2}$ at an implantation energy of about 200 KeV to about 400 KeV. Thus, the first transistors can selectively be transformed from the enhancement type into the depletion type for the data writing.

In a step (v-a), data are selectively written to the second transistors. More specifically, a resist pattern having openings only on selected second transistors is formed on the resulting semiconductor substrate, and ions having the same conductivity as the semiconductor substrate are implanted into the semiconductor substrate by using the resist pattern as a mask. For example, $B^+$ ions are preferably implanted in a dose of $1 \times 10^{14}$ cm$^{-2}$ to about $3 \times 10^{14}$ cm$^{-2}$ at an implantation energy of about 100 KeV to about 200 KeV. Thus, the threshold voltages of the selected second transistors can be set higher than a predetermined voltage for the data writing.

The step (iv-a) may precede or follow the step (v-a). The steps (iv-a) and (v-a) may precede the step (iii-a). By properly controlling the dose and the energy for the ion implantation, the transistors are allowed to operate at any desired gate voltage.

Alternatively, before the formation of the first word lines in the step (i-a), ions such as $P^+$ ions having a conductivity type different from that of the semiconductor substrate are implanted into at least the entire first transistor formation region in a dose on the order of $10^{13}$ cm$^{-2}$ at an implantation energy of about 30 KeV to about 80 KeV or, after the formation of the first word lines or after the formation of the second word lines, the ion implantation may be performed at a higher implantation energy of about 300 KeV to about 400 KeV which allows the ions to pass through the first word lines. Thereafter, the data writing to the selected first transistors is performed simultaneously with the data writing to the selected second transistors in a step following the step (iii-a). In such a case, a resist pattern having openings only on the selected first and second transistors is formed, and ions having the same conductivity type as the semiconductor substrate are implanted into the semiconductor substrate by using the resist pattern as a mask. The ion implantation is performed under the same conditions as in the step (v-a). Thus, the first transistors are selectively transformed from the D type into the E type so that the E-type and D-type first transistors are arranged in accordance with data arrangement and, at the same time, the threshold voltages of the selected second transistors are set higher than a predetermined voltage. By properly controlling the dose and the energy for the ion implantation, the transistors are allowed to operate at any desired gate voltage.

In the first fabrication process, ion implantation may be preliminary performed to adjust the thresholds of the first and second transistors prior to the step (i-a).

In the second process for fabricating a semiconductor device, a plurality of trenches extending in a first direction are formed in a semiconductor substrate so that the first and second transistors are formed in a three-dimentional configuration for higher density integration.

In the step (i-b), a plurality of trenches with a desired depth and width extending in the first direction are formed in a parallel relation in the semiconductor substrate by way of a known etching method. The depth and width of each of the trenches are properly determined depending on the channel lengths and the like of first and second transistors to be formed in a later step, but the trenches preferably each have a width of about 0.3 $\mu$m to about 1.0 $\mu$m and a width of about 0.3 $\mu$m to about 1.0 $\mu$m. In turn, a plurality of first word lines are formed in a parallel relation on side walls of the respective trenches with intervention of a first gate insulating film. The first gate insulating film is formed in the same manner as in the first fabrication process. The first word lines are each formed in a sidewall-spacer-like configuration by depositing polysilicon to a thickness such that the trenches are sufficiently filled therewith and etching back the deposited polysilicon. The material for the first word lines is not limited to polysilicon, but is preferably selected from lower resistance materials. The channel width of each second transistor to be formed in a later process is determined by the thickness of the first word line of sidewall-spacer-like configuration (measured along the horizontal) at an end thereof contacting the bottom of a trench.

In the step (ii-b), a resist pattern including a plurality of pattern lines extending perpendicular to the first word lines are formed in the same manner as in the first fabrication process, and ions are implanted into the resulting semiconductor substrate by using the resist pattern and the first word lines as a mask to form source/drain regions in upper surface portions of the substrate between the trenches and in trench bottom portions of the substrate. The ion implantation is performed under the same conditions as in the first fabrication process. Thus, first transistors are formed on the semiconductor substrate, each comprising a channel region formed in a trench sidewall portion, the first insulating film, a first word line, and source/drain regions respectively formed in an upper surface portion of the substrate between adjacent trenches and in a trench bottom portion of the substrate. The first transistors each share source/drain regions arranged in a second direction perpendicular to the first direction.

In the step (iii-b), a plurality of second word lines are formed in a parallel relation between the first word lines on the source/drain regions formed in the upper surface portions of the substrate between the trenches and in the trench bottom portions of the substrate with intervention of a second gate insulating film. The second gate insulating film is formed on the entire surface of the resulting semiconductor substrate including the first word lines, so that the first word lines are electrically isolated from the second word lines formed within the trenches. Alternatively, the second word lines may be isolated from the first word lines by forming an insulating film having a greater thickness on the first word lines. After the formation of the second gate insulating film, polysilicon is deposited on the entire surfaces of the resulting substrate such that the trenches are filled therewith, and then patterned by way of a known photolithographic/etching process, filling/etching process and/or CMP (chemical mechanical polishing) to form the second word lines on the bottoms of the trenches. Thus, second transistors are formed, each comprising a channel formed in a trench bottom portion of the substrate, the second gate insulating film formed on a bottom of a trench, a second word line and source/drain regions formed in the previous step. The second transistors each share source/drain regions of first transistors disposed adjacent thereto, thereby being connected to each other. A gate insulating film is formed on the resulting semiconductor substrate including the first word lines and the second word lines formed on the bottoms of the trenches in the same manner as described above, and then word lines are formed of the same material as described above on the gate insulating film. The gate insulating film and the word lines have the same functions as the second insulating film and the second word lines, respectively, and therefore are hereinafter referred to as "second insulating film" and "second word lines", respectively, for convenience. Preferably, the material and thickness of the second word lines thus formed on the top face of the semiconductor substrate are properly selected such that the second word lines formed on the bottoms of the trenches and on the top face of the substrate have substantially the same ion-implantation preventing capability to ensure that the channel regions of the transistors formed in the trench bottom portions of the substrate have the same ion concentration when data is written to the transistors by the ion implantation in the subsequent step. Thus, second transistors of another arrangement are formed, each having a channel region in an upper surface portion of the substrate, the second gate insulating film formed on the top face of the semiconductor substrate, a second word line, and source/drain regions formed in the previous step. These second transistors also each share source/drain regions of first transistors disposed adjacent thereto, thereby being connected to each other.

In the second fabrication process, device isolation is achieved in substantially the same manner as in the first fabrication process. The device isolation regions may be formed along the respective trenches in the semiconductor substrate. In this case, the ion implantation may be performed in multiple steps using different implantation energies, or oblique rotation ion implantation may be performed at an angle of about 15° to about 60° with respect to a normal to the semiconductor substrate.

In the second fabrication process, the data writing to the resulting semiconductor device can be achieved in substantially the same manner as in the first fabrication process.

In a step (iv-b), the ion implantation is performed in substantially the same manner as in the step (iv-a). In this case, $P^+$ ions are preferably implanted in a dose on the order of $10^{13}$ $cm^{-2}$ more than twice by employing different implantation energies in a range between about 300 KeV and about 1 MeV so that the ions are uniformly distributed throughout the channel regions in the trench side walls of the substrate. Thus, the first transistors can be transformed from the E type into the D type.

In a step (v-b), the ion implantation is performed in substantially the same manner as in the step (v-a). In this case, the ions are selectively implanted into the upper surface portions of the semiconductor substrate between the trenches and into the trench bottom portions of the substrate perpendicularly to the top face of the semiconductor substrate at one time. Thus, the threshold voltages of selected second transistors can be set higher than a predetermined voltage.

The step (iv-b) may precede or follow the step (v-b). The steps (iv-b) and (v-b) may precede the step (iii-b). By properly controlling the dose and the energy for the ion implantation, the transistors are allowed to operate at any desired gate voltage.

Alternatively, ions having a conductivity type different from that of the semiconductor substrate may be preliminary implanted into at least the entire first transistor formation region in the same manner as in the step (i-a) after the formation of the trenches, before or after the formation of the first word lines, or after the formation of the first and second word lines in the step (i-b). Thereafter, the data writing to the selected first transistors is performed simultaneously with the data writing to the selected second transistors in a step following the step (iii-b). In such a case, a resist pattern having openings only on the selected first and second transistors is formed on the resulting semiconductor substrate, and ions having the same conductivity type as the substrate are preferably implanted into the substrate more than three times by employing different doses and different implantation energies in a range between about 100 KeV to about 500 KeV and using the resist pattern as a mask. Thus, only the selected first transistors are transformed from the D type into the E type so that the E-type and D-type first transistors are arranged in accordance with data arrangement. Further, data can be selectively written to the second transistors formed on the top face portions of the semiconductor substrate and on the bottoms of the trenches at one time. By properly controlling the dose and the energy for the ion implantation, the transistors are allowed to operate at any desired gate voltage.

Further, the ion implantation may be performed in the same manner as in the first fabrication process after the formation of the trenches in the step (i-b) to adjust the thresholds of the first and second transistors. At this time, the threshold voltages of the first transistors formed on the side walls of the trenches and the threshold voltages of the second transistors formed on the top face portions between the trenches and on the bottoms of the trenches can be individually controlled by properly controlling the implantation angle for the ion implantation.

Although the aforesaid explanation for the second fabrication process is directed to a case where the first transistors are formed on the side walls of the trenches and the second transistors are formed on the top face portions of the semiconductor substrate between the trenches and on the bottoms of the trenches, the first transistors may be formed on the top face portions of the semiconductor substrate between the trenches and on the bottoms of the trenches and the second transistors may be formed on the side walls of the trenches. In such a case, oblique rotation ion implantation may be performed to form the source/drain regions in the trench sidewall portions of the substrate.

In the third process for fabricating a semiconductor device, a plurality of trenches extending in a second direction are formed in a semiconductor substrate.

In the step (i-c), a plurality of trenches extending parallel to each other in a second direction are formed in the semiconductor substrate in substantially the same manner as in the step (i-b). In turn, a plurality of first word lines are formed in a parallel relation on the semiconductor substrate with intervention of a first insulating film such that parts of the trenches are filled therewith. The first gate insulating film is formed in the same manner as in the second fabrication process. The formation of the first word lines can be achieved by depositing polysilicon or the like in a thickness such that the trenches are filled therewith and etching back the deposited polysilicon.

In the step (ii-c), a resist pattern having wide openings on memory cell areas is formed, and ions are implanted into the semiconductor substrate in the same manner as in the second fabrication process by using the first word lines and the resist pattern as a mask to form source/drain regions in upper surface portions of the substrate between the trenches and in trench bottom portions of the substrate. Thus, first transistors are formed, each comprising a channel region formed in an upper surface portion of the substrate between adjacent trenches or in a trench bottom portion of the substrate, the first gate insulating film, a first word line, and source/drain regions formed in an upper surface portion of the substrate between adjacent trenches or in a trench bottom portion of the substrate. The first transistors juxtaposed in the second direction each share a source/drain region formed in an upper surface portion of the substrate between adjacent trenches or in a bottom portion of the substrate.

In the step (iii-c), a plurality of second word lines are formed in a parallel relation on the source/drain regions formed in the upper surface portions of the semiconductor substrate between the trenches and in the trench bottom portions of the substrate with intervention of a second gate insulating film. Thus, second transistors are formed, each comprising a channel region formed in a trench sidewall portion of the substrate, the second gate insulating film formed on a side wall of a trench, a second word line and source/drain regions formed in the previous step. The second transistors each share a source/drain region of a first transistor disposed adjacent thereto, thereby being connected to each other.

In the third fabrication process, the device isolation is achieved in substantially the same manner as in the first fabrication process. More specifically, device isolation regions may be formed in any of the following manners. In a first method, the semiconductor substrate not formed with the trenches is first subjected to ion implantation for device isolation, and then the trenches are formed in the semiconductor substrate, whereby the device isolation regions are formed between the trenches in the semiconductor substrate. In a second method, the trenches are first formed in the semiconductor substrate, and then device isolation regions are formed in the semiconductor substrate for the respective transistors which are to be formed in the subsequent step. In a third method, the trenches are first formed in the semiconductor substrate, and then oblique rotation ion implantation is performed at an implantation angle of about 15° to about 60° with respect to a normal to the semiconductor substrate to form the device isolation regions. In a fourth method, the trenches and the gate electrodes are first formed, and then ion implantation is performed at a desired implantation energy to form the device isolation regions. These methods may be used in combination.

In the third fabrication process, the data writing to the resulting semiconductor device can be achieved in substantially the same manner as in the first fabrication process.

In a step (iv-c), the ion implantation is performed in substantially the same manner as in the step (iv-a). Thus, the first transistors can selectively be transformed from the E type into the D type.

In a step (v-c), the ion implantation is performed in substantially the same manner as in the step (v-a). At this time, $B^+$ ions are implanted in a dose of about $1\times10^{14}$ cm$^{-2}$ to about $3\times10^{14}$ cm$^{-2}$ at an implantation energy of about 150 KeV to about 400 KeV. Thus, the threshold voltages of the second transistors can selectively be set higher than a predetermined voltage.

The step (iv-c) may precede or follow the step (v-c). The steps (iv-c) and (v-c) may precede the step (iii-c). By properly controlling the dose and the energy for the ion implantation, the transistors are allowed to operate at any desired gate voltage.

Alternatively, in the step (i-c), ions having a conductivity type different from that of the semiconductor substrate may be preliminary implanted into at least the entire first transistor formation region in the same manner as in the step (i-a) or (i-b). The data writing to the selected first transistors may be performed simultaneously with the data writing to the selected second transistors, for example, after the step (iii-c). In such a case, a resist pattern having openings only on the selected first and second transistors is formed on the resulting semiconductor substrate, and ions having the same conductivity type as the substrate are preferably implanted into the substrate more than three times by employing different doses and different implantation energies in a range between about 100 KeV to about 500 KeV and using the resist pattern as a mask. That is, by using the different implantation energies, ROM data are written to the selected transistors, the channel regions of which are formed in the upper surface portions of the substrate between the trenches, in the trench sidewall portions of the substrate or in the trench bottom portions of the substrate. Thus, the first transistors can selectively be transformed from the D type into the E type so that the E-type and D-type first transistors are arranged in accordance with data arrangement. At the same time, data can selectively be written to the second transistors formed on the side walls of the trenches. By properly controlling the dose and the energy for the ion implantation, the transistors are allowed to operate at any desired threshold voltage.

Further, in the step (i-c), the ion implantation may be performed in the same manner as in the step (i-a) after the formation of the trenches to adjust the thresholds of the first and second transistors.

Although the aforesaid explanation for the third fabrication process is directed to a case where the first transistors are formed on the top face portions of the semiconductor substrate between the trenches and on the bottoms of the trenches and the second transistors are formed on the side walls of the trenches, it is also possible to form the first transistors on the side walls of the trenches and the second transistors on the top face portions of the substrate between the trenches and on the bottoms of the trenches by properly controlling the conditions for the ion implantation for the formation of the source/drain regions thereof. In such a case, oblique rotation ion implantation may be employed to form the source/drain regions in the trench sidewall portions of the substrate.

The turnaround time of the semiconductor device fabrication can be shortened by performing the data writing later in the process sequence. Therefore, the formation of an interlayer insulating film, contact holes, metal interconnections and the like may precede the data writing in the fabrication processes of the present invention.

Where the first and second transistors are formed as flash-gate transistors, a tunnel oxide film having a thickness of about 60 Å to about 120 Å is formed, for example, by a thermal oxidation method prior to the formation of the first gate insulating film and/or the second gate insulating film. In turn, polysilicon is deposited thereon to a thickness of about 1,000 Å to about 2,000 Å, and patterned such that polysilicon films are formed on channel regions of the respective transistors. Then, the first gate insulating film and/or the second gate insulating film, the first word lines and/or the second word lines and the like are formed.

The semiconductor devices and the fabrication processes therefor according to the present invention will hereinafter be described in detail by way of embodiments thereof.

Embodiment 1

FIG. 1 is an equivalent circuit diagram of a mask ROM which is an exemplary semiconductor device according to the present invention. The semiconductor device has a plurality of first transistor rows each including a plurality of first transistors (NAND memory cells) connected in series and a plurality of second transistor rows each including a plurality of second transistors (NOR memory cells). The first transistor rows and the second transistor rows are arranged in an alternate relation. The plurality of first transistors in each of the first transistor rows each share a source/drain region of an adjacent first transistor so as to be connected to each other, and are respectively connected to different word lines (e.g., W11, W12, W13, . . . ). The plurality of second transistors in each of the second transistor rows are each connected to a source/drain region (e.g., S11 or S21) of a first transistor in one first transistor row and a source/drain region (e.g., S12 or S22) of another first transistor in another first transistor row. The second transistors in each of the second transistor rows are respectively connected to different word lines (e.g., W21, W22, . . . ).

In the semiconductor device having such a construction, the NAND memory cell transistors are selectively transformed, for example, from the E type into the D type for ROM data writing. On the other hand, the threshold voltages of the NOR memory cell transistors are selectively set to a predetermined voltage or a voltage higher than a supply voltage for ROM data writing.

There will next be described a method of reading data from the semiconductor device having the aforesaid construction.

To read data from a NAND memory cell, the word lines W21 and W22 of the NOR memory cells are all set to LOW level to turn off all the transistors of the NOR memory cells. Then, the word lines of NAND memory cell selected for data reading are set to LOW level, and the word lines of unselected NAND memory cells are all set to HIGH level. Thus, transistors other than the selected memory cell transistors are all turned on. If the NAND memory transistors selected for data reading are of the enhancement type, the continuity between a bit line and a ground line for a first transistor row including these transistors is not established. If the selected NAND memory transistors are of the depletion type, the continuity is established, thereby permitting the ROM data to be read from the NAND memory cell.

To read data from a NOR memory cell, the word lines W11, W12 and W13 of the NAND memory cells are all set to HIGH level to turn on all the NAND memory cell transistors, so that continuity through the NAND memory cell transistors in each of the first transistor rows is established for interconnection. In turn, word lines of the NOR memory cell selected for data reading are set to HIGH level, and the word lines of unselected NOR memory cells are all set to LOW level, whereby transistors other than the selected memory cell transistors are all turned off. Thus, the ROM data reading is permitted depending on whether the continuity between a bit line and a ground line for a second transistor row including these NOR memory cell transistors is established.

Since high concentration diffusion layers serving as an auxiliary bit line for the NOR memory cells are used for the NAND memory cell transistors, regions which are otherwise used for interconnection in the prior art can be used as memory cells. Thus, the integration level can be almost doubled.

Figure 2:
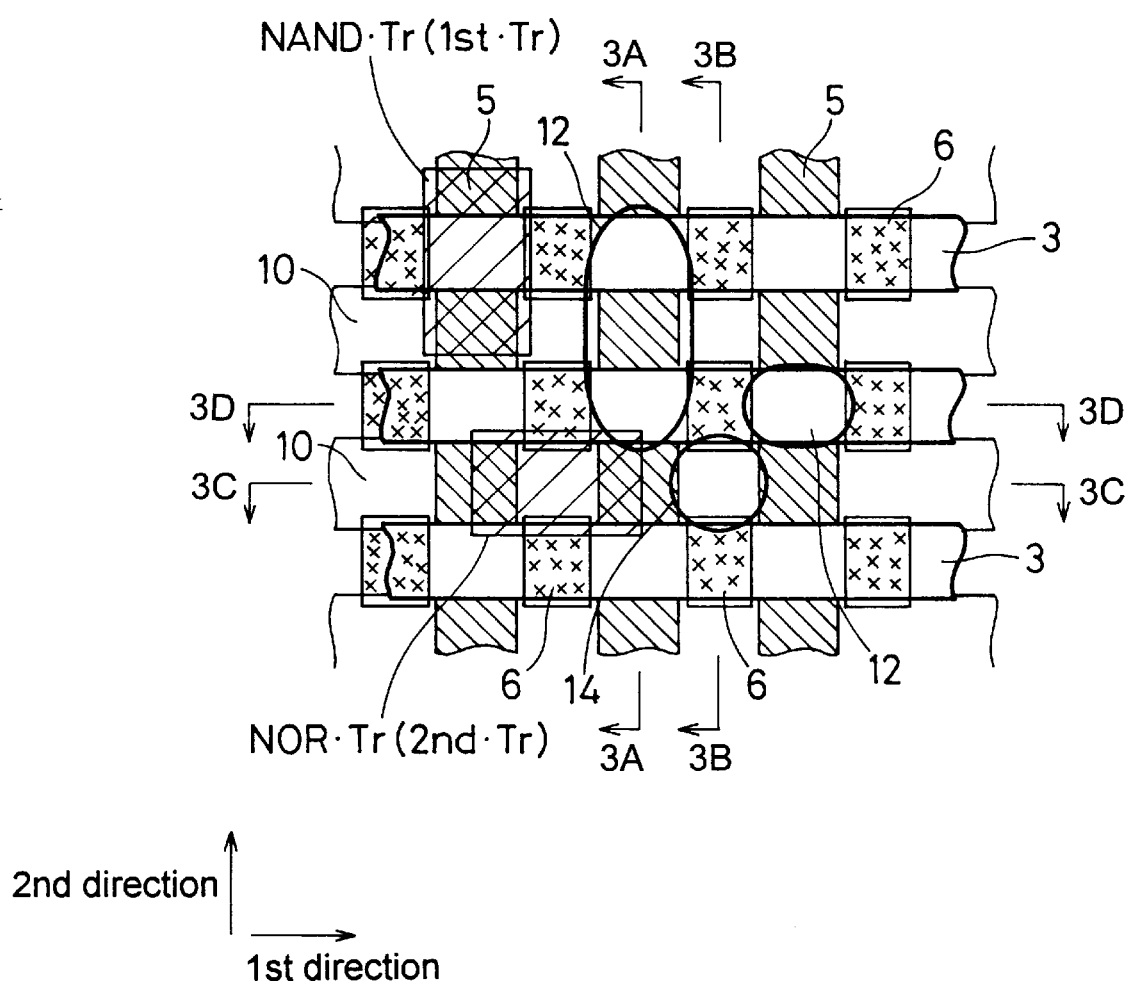
FIG. 2 is a plan view illustrating the semiconductor device according to the present invention.
Figure 3A:
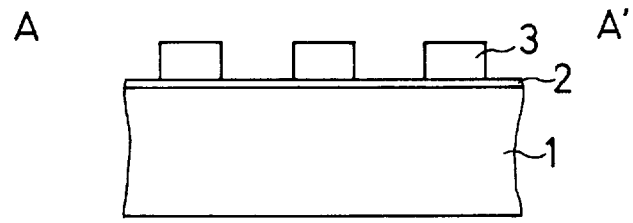
FIG. 3(a) to FIG. 3(d) are schematic sectional views taken along lines A–A', B–B', C–C' and D–D', respectively, in FIG. 2 for explaining a fabrication process for the semiconductor device.
Figure 3B:
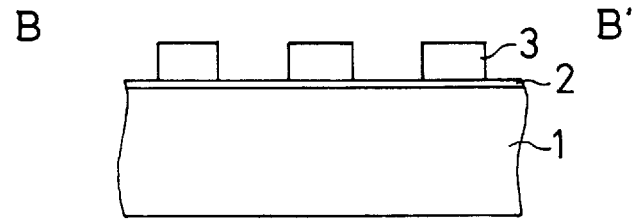
Figure 3C:
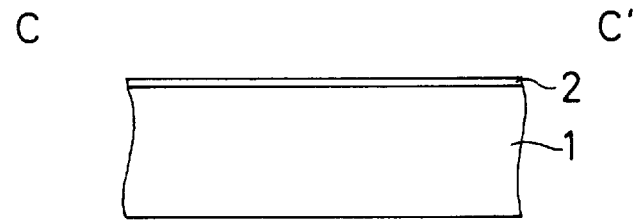
Figure 3D:
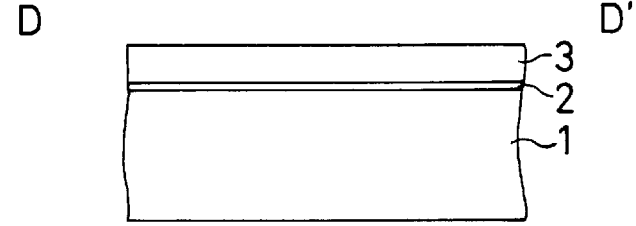
Figure 4A:
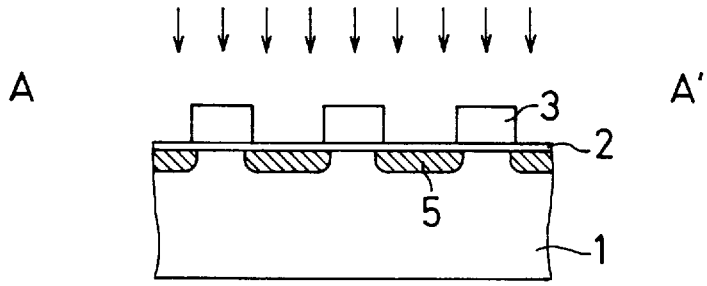
FIG. 4(a) to FIG. 4(d) are schematic sectional views taken along lines A–A', B–B', C–C' and D–D', respectively, in FIG. 2 for explaining the fabrication process.
Figure 4B:
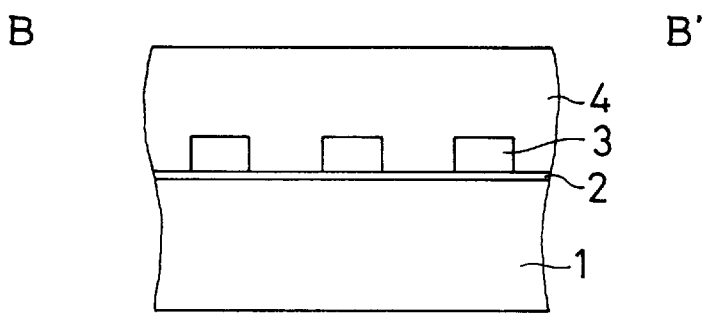
Figure 4C:
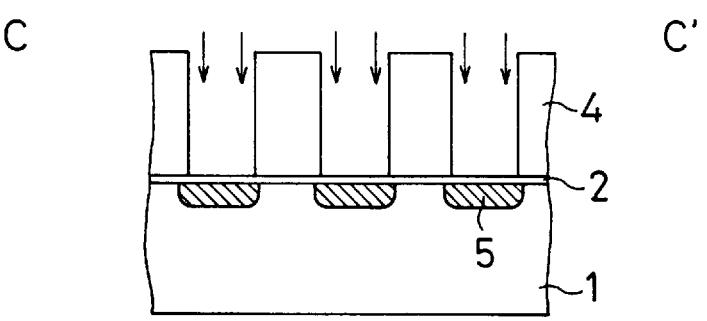
Figure 4D:
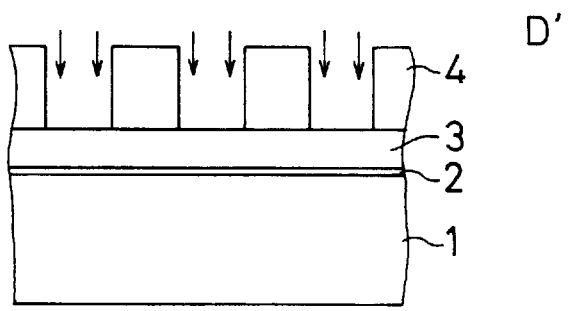
Figure 5A:
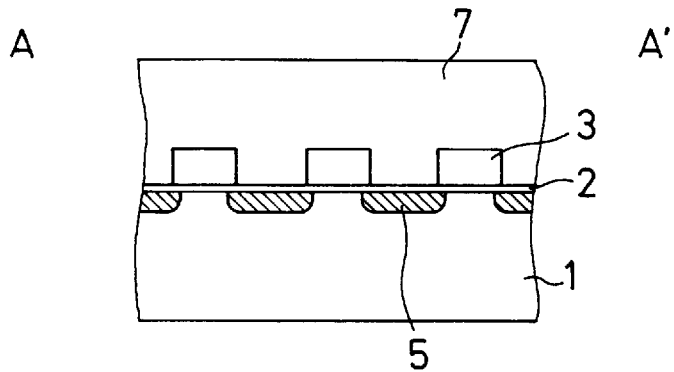
FIG. 5(a) to FIG. 5(d) are schematic sectional views taken along lines A–A', B–B', C–C' and D–D', respectively, in FIG. 2 for explaining the fabrication process.
Figure 5B:
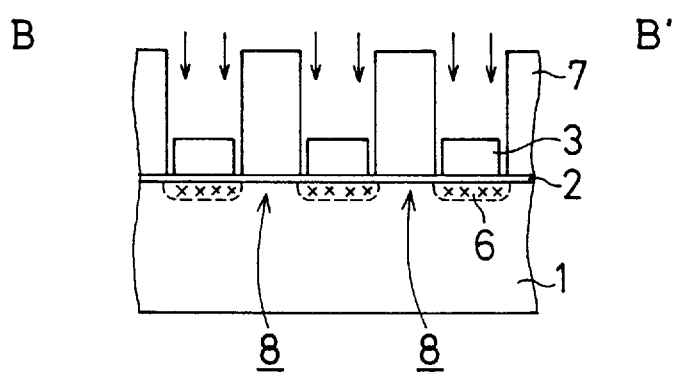
Figure 5C:
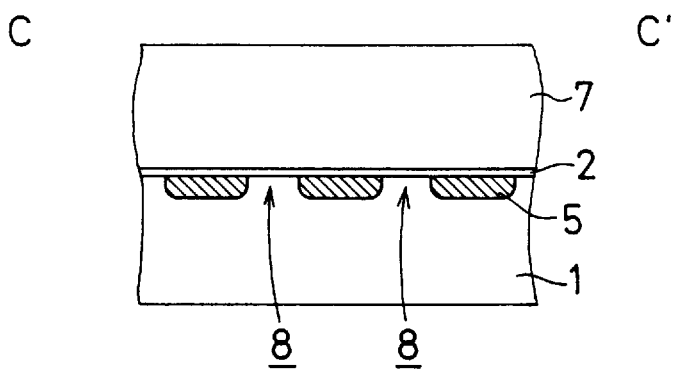
Figure 5D:
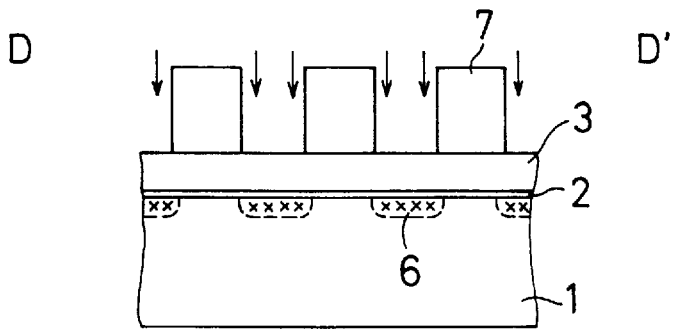
Figure 6A:
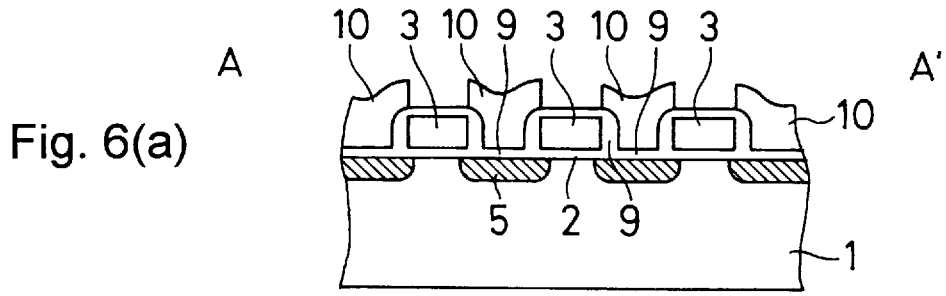
FIG. 6(a) to FIG. 6(d) are schematic sectional views taken along lines A–A', B–B', C–C' and D–D', respectively, in FIG. 2 for explaining the fabrication process.
Figure 6B:
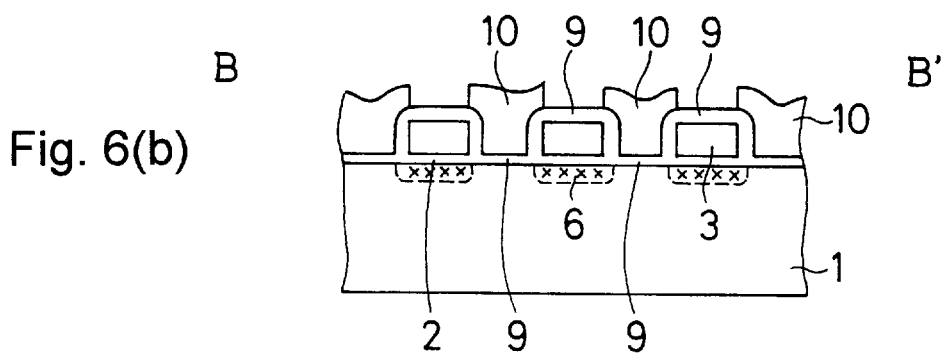
Figure 6C:
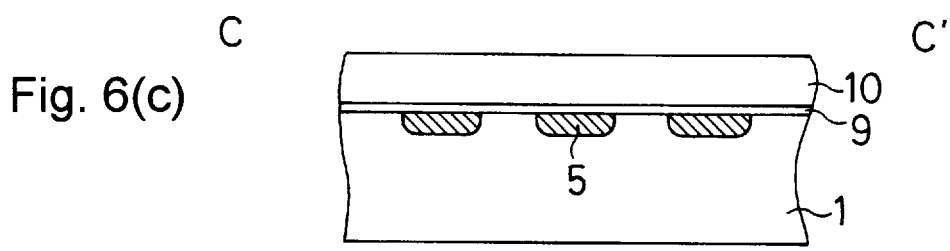
Figure 6D:
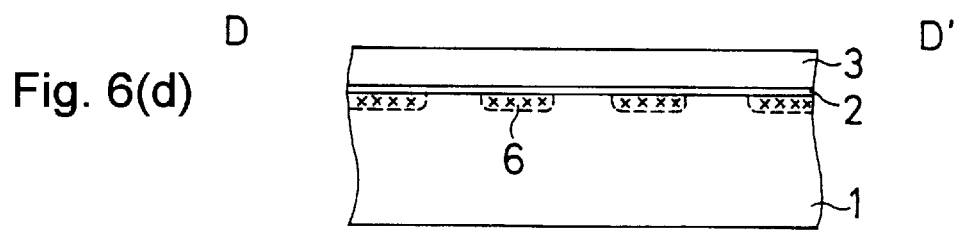

A semiconductor device having a construction represented by the equivalent circuit diagram of FIG. 1 is shown in FIG. 2 and FIG. 6(a) to FIG. 6(d). FIG. 2 is a plan view of the semiconductor device, and FIG. 6(a), FIG. 6(b), FIG. 6(c) and FIG. 6(d) are sectional views taken along lines A–A', B–B', C–C' and D–D', respectively, in FIG. 2.

As shown in FIG. 2 and FIG. 6(a) to FIG. 6(d), a plurality of first gate electrodes 3 (first word lines) of first transistors of NAND memory cells extending in a first direction are formed in a parallel relation on a semiconductor substrate 1. Second gate electrodes 10 (second word lines) of second transistors of NOR memory cells are disposed between the first gate electrodes 3. Source/drain regions 5 (high concentration impurity regions) also serving as bit lines for the NAND memory cells are formed in the semiconductor substrate 1 between the first gate electrodes 3 just below the second gate electrodes 10. Device isolation regions 6 are formed in regions of the semiconductor substrate 1 just below the first gate electrodes 3 where the NAND memory cells are not formed. The device isolation regions 6 are formed by implanting into the substrate an impurity having the same conductivity type as the semiconductor substrate 1.

A process for fabricating the aforesaid semiconductor device will be described with reference to FIG. 3(a) to FIG. 3(d), FIG. 4(a) to FIG. 4(d), FIG. 5(a) to FIG. 5(d), FIG. 6(a) to FIG. 6(d), FIG. 7(a) to FIG. 7(d) and FIG. 8(a) to FIG. 8(d). FIG. 3(a) to FIG. 8(a), FIG. 3(b) to FIG. 8(b), FIG. 3(c) to FIG. 8(c), and FIG. 3(d) to FIG. 8(d) are sectional views taken along lines A–A', B–B', C–C' and D–D', respectively, in FIG. 2.

As shown in FIG. 3(a) to FIG. 3(d), the first gate insulating film 2 having a thickness of about 50 Å to about 300 Å is formed on the semiconductor substrate 1. Then, the plurality of first gate electrodes 3 extending parallel to each other in the first direction are formed as the first word lines on the first gate insulating film 2. The first gate electrodes 3 is of a double-layer structure comprising a lower layer of N$^+$ polysilicon having a thickness of about 1,000 Å and an upper layer of tungsten silicide having a thickness of about 1000 Å, for example.

As shown in FIG. 4(a) to FIG. 4(d), a resist is applied on the resulting semiconductor substrate 1 formed with the first gate electrodes 3, and patterned to form a resist pattern 4 including a plurality of pattern lines extending perpendicular to the first gate electrodes 3. The source/drain regions 5 are formed by ion implantation using the resist pattern 4 as a mask. The ion implantation uses impurity ions having a conductivity type opposite to that of the semiconductor substrate 1. Where the first transistors are to be formed as NMOSs, for example, arsenic (As$^+$) ions are implanted into the substrate 1 in a dose of $3\times10^{15}$ cm$^{-2}$ at an implantation energy of about 40 KeV. Thus, the first transistors constituting the NAND memory cells are formed, each comprising the first gate insulating film 2, a first gate electrode 3 and source/drain regions 5.

In turn, as shown in FIG. 5(a) to FIG. 5(d), a resist is applied on the semiconductor substrate 1 and the first gate electrodes 3, and patterned to form a resist pattern 7 having openings on desired regions under the first gate electrodes 3, i.e., on regions where device isolation regions 6 are to be formed for isolating the first transistors formed in the previous step from each other. Ions having the same conductivity type as the semiconductor substrate 1 are implanted into the regions intended for the device isolation regions 6 under the first gate electrodes 3 by using the resist pattern 7 as a mask. More specifically, boron ions are implanted therein in a dose of $1.5\times10^{14}$ cm$^{-2}$ at an implantation energy of 140 KeV, for example. It should be noted that, even if the ions are implanted into regions other than the device isolation regions 6 under the first gate electrodes 3 (i.e., the channel regions 8 of the second transistors constituting the NOR memory cells) due to masking offset of the resist pattern 7, the implanted ions exert little influence to the memory cells. This is because the ions are implanted to a great depth in the semiconductor substrate 1 in the absence of the first electrodes 3 thereabove. The ions implanted to the great depth below the channel regions 8 may be utilized for punch-through prevention of the second transistors. However, sufficient margins should be provided to prevent the ions from being implanted into the channel regions of the first transistors 1.

Subsequently, as shown in FIG. 6(a) to FIG. 6(d), the second gate insulating film 9 is formed on the entire surface of the resulting semiconductor substrate 1 including the first gate electrodes 3. The plurality of the second gate electrodes 10 are formed as the second word lines in a parallel relation between the first gate electrodes 3 on the second gate insulating film 9. The second gate electrodes 10 are formed, for example, of N$^+$ polysilicon or tungsten polycide in a thickness of about 2,000 Å to about 3,000 Å by photolithographic and etching processes. Thus, the second transistors constituting the NOR memory cells are formed, each comprising the second gate insulating film 9, a second gate electrode 10 and source/drain regions 5.

In turn, ROM data are written to the NAND memory cells and to the NOR memory cells separately. To write NAND ROM data in first transistors of a NAND memory cell, phosphorus (P$^+$) ions, for example, are implanted into implantation regions 12 in a dose of $5\times10^{13}$ cm$^{-2}$ at an implantation energy of 300 KeV by using a resist pattern 11 for NAND ROM data writing as a mask, as shown in FIG. 7(a) to FIG. 7(d). The implantation regions 12 preferably overlap with the source/drain regions 5 as shown in FIG. 7(a), and are preferably spaced from the device isolation regions 6 with a margin M provided therebetween as shown in FIG. 7(d). Thus, the NAND memory cell transistors can be selectively transformed from the E type into the D type.

To write NOR ROM data in second transistors of a NOR memory cell, ions such as boron ions having the same conductivity type as the semiconductor substrate are implanted in a dose of $2\times10^{14}$ cm$^{-2}$ at an implantation energy of 150 KeV by using a resist pattern 13 for NOR ROM data writing as a mask, as shown in FIG. 8(a) to FIG. 8(d). Thus, the threshold voltages of the second transistors are selectively set higher than a supply voltage, whereby the selected transistors are rendered off. The implantation regions 14 should overlap with the device isolation regions 6 to ensure that the selected second transistors 2 be rendered off. Even if the implantation regions 14 are slightly offset from the intended positions, the ion implantation exerts little influence to adjacent transistors because the channel regions of the first transistors and the second transistors are arranged in a checkered array as viewed in plan.

Thereafter, the resulting semiconductor substrate is subjected to process steps for the formation of an interlayer insulating film, contact holes, metal interconnections and protection film. Thus, the semiconductor fabrication process is completed, which is followed by the assembly of the semiconductor device.

The turnaround time of the semiconductor device fabrication can be shortened by performing the ROM data writing later in the process sequence. Therefore, the formation of the interlayer insulating film, the contact holes, the metal interconnections and the like may precede the data writing. In such a case, the ion implantation for the data writing is performed at a high implantation energy.

Embodiment 2

Figure 9:
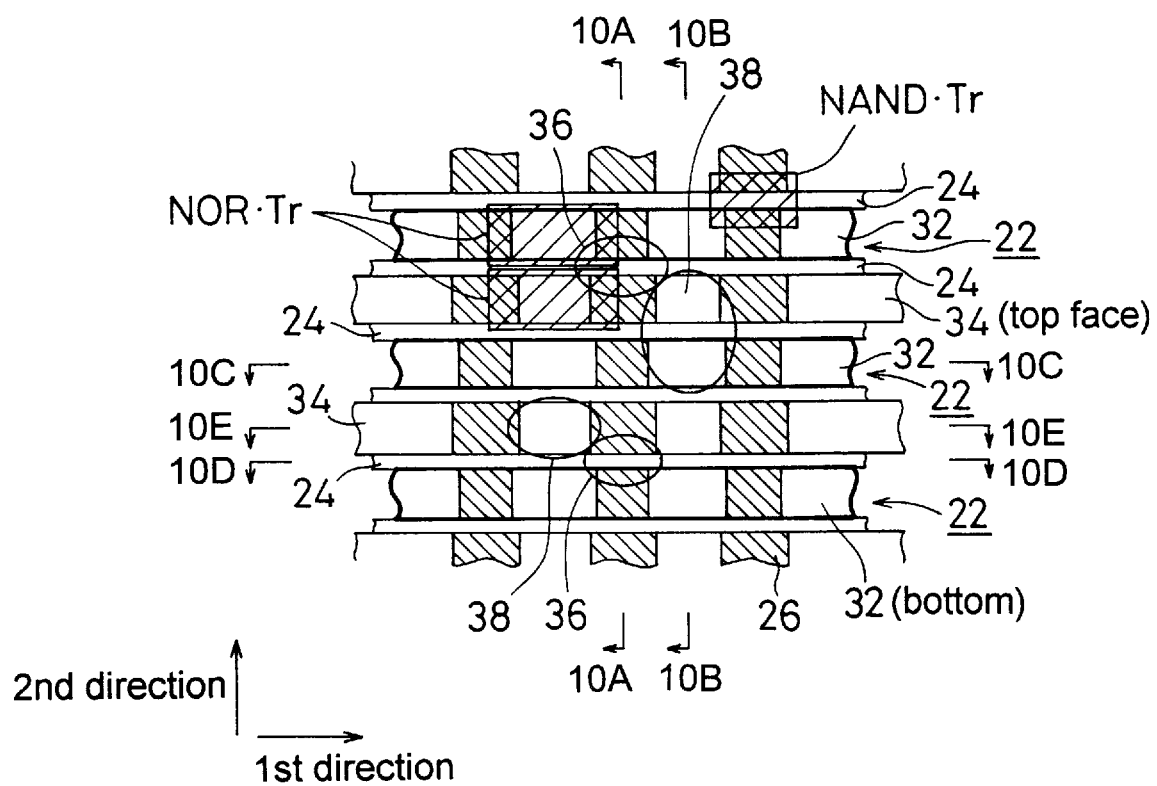
FIG. 9 is a plan view illustrating another semiconductor device according to the present invention.

Another semiconductor device represented by the equivalent circuit diagram of FIG. 1 is shown in FIG. 9 and FIG. 13(a) to FIG. 13(e). FIG. 9 is a plan view thereof and FIG. 13(a), FIG. 13(b), FIG. 13(c), FIG. 13(d) and FIG. 13(e) are sectional views taken along lines A–A', B–B', C–C', D–D' and E–E', respectively, in FIG. 9.

To further improve the integration level of the semiconductor device in comparison with Embodiment 1, a plurality of trenches 22 extending parallel to each other in a first direction are formed in a semiconductor substrate 21 as shown in FIG. 9 and FIG. 13(a) to FIG. 13(e). First transistors constituting NAND memory cells are formed, each comprising a sidewall gate 24 provided as a first word line on a side wall of a trench 22 with intervention of a first gate insulating film 23, a channel region formed in a trench sidewall portion of the substrate, and source/drain regions 26a and 26b respectively formed in a trench bottom portion of the substrate and in an upper surface portion of the substrate 21 between adjacent trenches 22. Second transistors constituting NOR memory cells are formed, each comprising a bottom gate electrode 32 formed as a second word line in a trench 22 with intervention of insulating films 30 on sidewall gates 24 formed on the opposite side walls of the trench 22 and with intervention of a second gate insulating film 31 on the bottom of the trench 22, and source/drain regions 26a which are shared with adjacent first transistors. Further, second transistors constituting NOR memory cells are formed, each comprising a top gate electrode 34 formed as a second word line parallel to the trenches 22 on a top face portion of the semiconductor substrate 21 between adjacent trenches 22 with intervention of a second gate insulating film 33, and source/drain regions 26b which are shared with adjacent first transistors.

A process for fabricating the aforesaid semiconductor device will be described with reference to FIG. 10(a) to FIG. 10(e), FIG. 11 (a) to FIG. 11 (e), FIG. 12(a) to FIG. 12(e), FIG. 13(a) to FIG. 13(e), FIG. 14(a) to FIG. 14(e) and FIG. 15(a) to FIG. 15(e). FIG. 10(a) to FIG. 15(a), FIG. 10(b) to FIG. 15(b), FIG. 10(c) to FIG. 15(c), FIG. 10(d) to FIG. 15(d) and FIG. 10(e) to FIG. 15(e) are sectional views taken along lines A–A', B–B', C–C', D–D' and E–E', respectively, in FIG. 9.

As shown in FIG. 10(a) to FIG. 10(e), the plurality of trenches 22 are formed in a parallel relation in the semiconductor substrate 21 by a known etching process. The trenches preferably each have a depth (e.g., about 0.5 μm) equivalent to a channel length of each first transistor of a NAND memory cell to be formed in the subsequent step. To control the threshold voltages of the first and second transistors, ions such as $B^+$ ions having the same conductivity type as the semiconductor substrate 21 are implanted into the semiconductor substrate 21 in a dose of about $3\times10^{12}$ cm$^{-2}$ at an implantation energy of 35 KeV by way of oblique rotation ion implantation employing a line normal to a surface of the semiconductor substrate 21 as a rotation axis and an implantation angle of about 30° with respect to the normal line. By employing different implantation angles, the threshold voltages of the channels of the first transistors of the NAND memory cells (formed in the trench sidewall portions) and the threshold voltages of the channels of the second transistors of the NOR memory cells (formed in the trench bottom portions and in the upper surface portions of the semiconductor substrate 21) can be individually controlled.

In turn, the first gate insulating film 23 having a thickness of about 50 Å to about 300 Å is formed on the entire surface of the semiconductor substrate 21 including the trenches 22. Then, a conductive film is formed on the gate insulating film 23, and etched back to form the plurality of sidewall gates 24 as the first word lines on the opposite side walls of the trenches 22. The sidewall gates 24 are formed, for example, of $N^+$ polysilicon.

Subsequently, sidewall gates 24 on the opposite side walls of each trench 22 which are joined at an end of the trench 22 are cut to be separated from each other. At this time, one of the sidewall gates 24 preferably has a longer extension at an end thereof for easy formation of a contact hole therein.

Thereafter, a resist is applied on the entire surface of the resulting semiconductor substrate 21 including the trenches 22, and patterned to form a resist pattern 25 having a plurality of pattern lines each extending perpendicular to the sidewall gates 24. Then, impurity ions having a conductivity type opposite to that of the semiconductor substrate 21 are implanted into the resulting semiconductor substrate 21 by using the resist pattern 25 and the side wall gates 24 as a mask to form source/drain regions 26a and 26b in the trench bottom portions of the semiconductor substrate 21 and in the upper surface portions of the semiconductor substrates 21 between the trenches, respectively. Where the first transistors are to be formed as NMOSs, for example, arsenic ($As^+$) ions are implanted in a dose of about $3\times10^{15}$ cm$^{-2}$ at an implantation energy (e.g., 40 KeV) such that the ions are distributed only in the sidewall gates 24. Thus, the first transistors constituting the NAND memory cells are formed, each comprising the first gate insulating film 23, a sidewall gate 24, and source/drain regions 26a and 26b.

The ion implantation for the formation of the source/drain regions may be performed after insulating films 30 are formed on the sidewall gates 24 (see FIG. 12(a)). The formation of the insulating films makes it possible to reduce the trench depth by the thickness of the insulating film while ensuring the same channel length, thereby minimizing the level difference on the top face of the semiconductor substrate. Thus, semiconductor elements, semiconductor memories and like semiconductor devices can be formed at a reduced pitch for size reduction thereof.

Figures 11A, 11B, 11C, 11D, 11E:
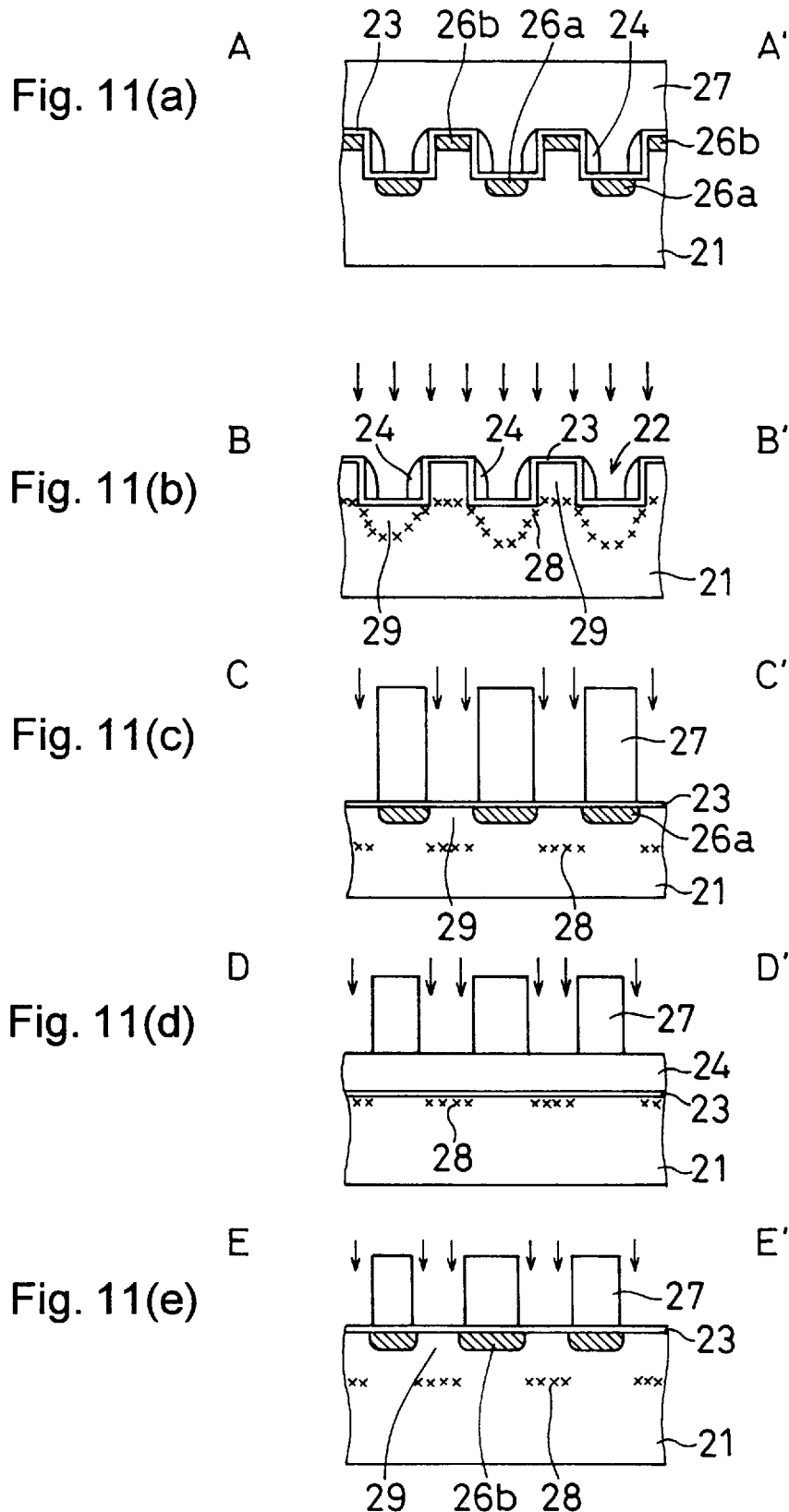
FIG. 11 (a) to FIG. 11 (e) are schematic sectional views taken along lines A–A', B–B', C–C', D–D' and E–E', respectively, in FIG. 9 for explaining the fabrication process.
Figure 14A:
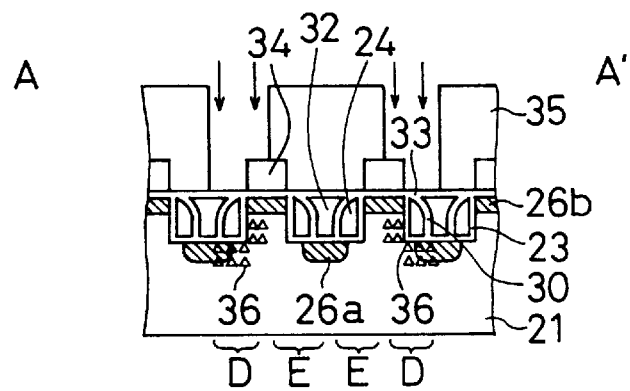
FIG. 14(a) to FIG. 14(e) are schematic sectional views taken along lines A–A', B–B', C–C', D–D' and E–E', respectively, in FIG. 9 for explaining the fabrication process.
Figure 14B:
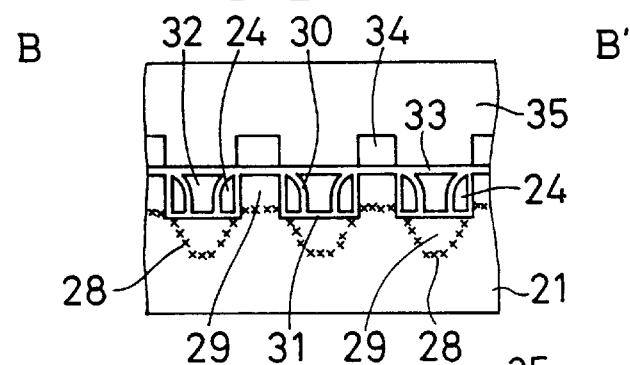
Figure 14C:
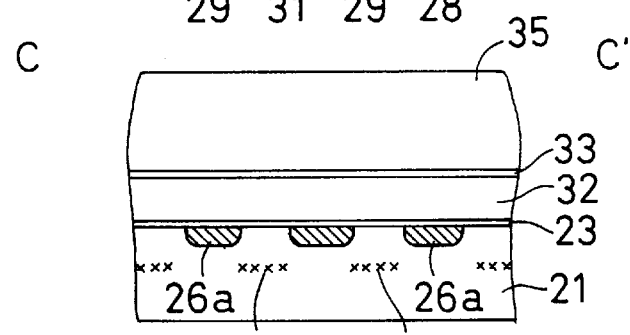
Figure 14D:
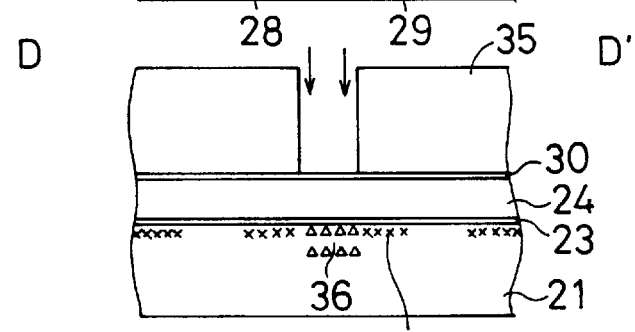
Figure 14E:
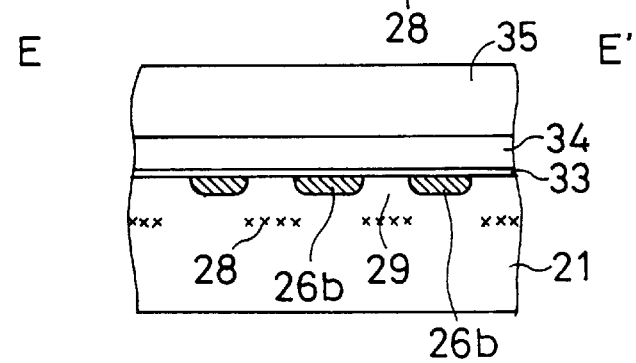

As shown in FIG. 11 (a) to FIG. 11 (e), a resist is applied on the resulting semiconductor substrate 21 including the trenches 22 and the sidewall gates 24, and patterned to form a resist pattern 27 such that the first transistors formed in the previous step are covered therewith. Ions having the same conductivity type as the semiconductor substrate 21 are implanted into regions 28 (which are to be formed into the device isolation regions) by using the resist pattern 27 and the sidewall gates 24 as a mask. At this time, boron ions are implanted therein in a dose of $2\times10^{14}$ cm$^{-2}$ more than twice by employing different implantation energies (e.g., about 120 KeV and about 200 KeV). Thus, the ions can be uniformly implanted in a depthwise direction from the side walls of the trenches to perfectly isolate the channels formed in the trench sidewall portions. The ions are implanted to a great depth in the trench sidewall portions of the semiconductor substrate below the sidewall gates 24 and in regions not formed with the source/drain regions 26a and 26b, i.e., in regions 29 which are to be formed into channel regions of the second transistors of the NOR memory cells in the subsequent step. Therefore, the ions implanted therein exert little influence to the thresholds of the second transistors. Further, the ion implantation to the great depth in the semiconductor substrate is effective for reduction in the channel length, because it prevents the punch-through of the second transistors of the NOR memory cells. Oblique rotation ion implantation may be performed for the device isolation after the formation of the trenches 22 before the formation of the sidewall gates 24. The device isolation may be achieved by forming device isolation oxide films.

Subsequently, as shown in FIG. 12(a) to FIG. 12(e), the second gate insulating films 31 are formed on the bottoms of the trenches 22, and the insulating films 30 are formed on the sidewall gates 24. The bottom gate electrodes 32 are formed as the second word lines on the insulating films 30 and the second gate insulating films 31 such that the trenches are filled up therewith. The bottom gate electrodes 32 are formed, for example, of $N^+$ polysilicon in a self-alignment manner by way of a known photolithographic/dry-etching process, filling/etching-back process or a CMP (chemical mechanical polishing) process or combination of these processes. Thus, the second transistors of the NOR memory cells are formed, each comprising a second gate insulating film 31, a bottom gate electrode 32, source/drain regions 26a.

In turn, as shown in FIG. 13(a) to FIG. 13(e), the second gate insulating films 33 are formed on the top face portions of the resulting semiconductor substrate 21 between the trenches 22, and then the top gate electrodes 34 extending parallel to the trenches 22 are formed as the second word lines on the resulting semiconductor substrate 21 with intervention of the second gate insulating films 33. The top gate electrodes 34 are, for example, of a double-layer structure comprising a lower layer of $N^+$ polysilicon having a thickness of 1,000 Å and an upper layer of tungsten silicide having a thickness of 1,500 Å. Preferably, the materials and thicknesses of the upper and lower layers of the top gate electrodes 34 are properly selected to impart the bottom gate electrodes 32 and the top gate electrodes 34 with equivalent ion-implantation preventing capabilities such that ions can be equivalently distributed in the channel regions formed in the trench bottom portions of the substrate 21 and in the upper surface portions of the substrate 21 for NOR ROM data writing in the subsequent step. Thus, the second transistors of the NOR memory cells are formed, each comprising a second gate insulating film 33, a top gate electrode 34 and source/drain regions 26b. The top gate electrodes 34 may also be used as gate electrodes of peripheral circuitry other than the memory cells or as interconnections. Since interconnections from the top gate electrodes 34 can be freely routed on the sidewall gates 24 and the bottom gate electrodes 32, it is possible to detour contact holes formed at ends of the sidewall gates 24 and the bottom gate electrodes 32 for the routing.

Subsequently, ROM data are written to the NAND memory cells and the NOR memory cells separately. When NAND ROM data are to be written to selected first transistors of NAND memory cells, as shown in FIG. 14(a) to FIG. 14(e), phosphorus ($P^+$) ions are implanted into channel regions 36 of the selected first transistors at implantation energies of about 500 KeV and about 700 KeV such that the ions are distributed in a concentration on the order of $10^{18}$ $cm^{-3}$ by using a resist pattern 35 for NAND ROM data writing as a mask. For uniform ion distribution in the channel regions 36 (the trench sidewall portions and the trench bottom portions of the substrate) of the selected first transistors, the ion implantation is preferably performed in multiple steps using different implantation energies. The NAND ROM data writing may be achieved by one-side oblique ion implantation to the side walls of the trenches 22 before or after the formation of the sidewall gates 24. Thus, the NAND memory cell transistors can be selectively transformed from the E type into the D type.

When NOR ROM data are to be written to selected second transistors of NOR memory cells, ions such as boron ions having the same conductivity type as the semiconductor substrate are implanted into channel regions 38 of the selected second transistors in a dose of $2 \times 10^{14}$ $cm^{-2}$ at an implantation energy of 200 KeV by using a resist pattern 37 for NOR ROM data writing as a mask as shown in FIG. 15(a) to FIG. 15(e). Thus, the threshold voltages of the second transistors are selectively set higher than a supply voltage, whereby the selected transistors are rendered off. Particularly in the ion implantation into channel regions formed in the trench bottom portions, the ions are implanted to a great depth in the substrate 21 from the top face thereof through the bottom gate electrodes 32 and, if oblique ion implantation is employed, a positional offset of the implantation regions may result. Therefore, the implantation angle is preferably 0° with respect to a normal to the top face of the substrate.

The turnaround time of the semiconductor device fabrication can be shortened by performing the ROM data writing later in the process sequence. Therefore, the formation of an interlayer insulating film, a metal interconnections and the like may precede the data writing. In such a case, the ion implantation for the data writing is performed at a high implantation energy, like the first fabrication process.

Thereafter, the semiconductor device fabrication process is completed in the same manner as in Embodiment 1.

Embodiment 3

Figure 16:
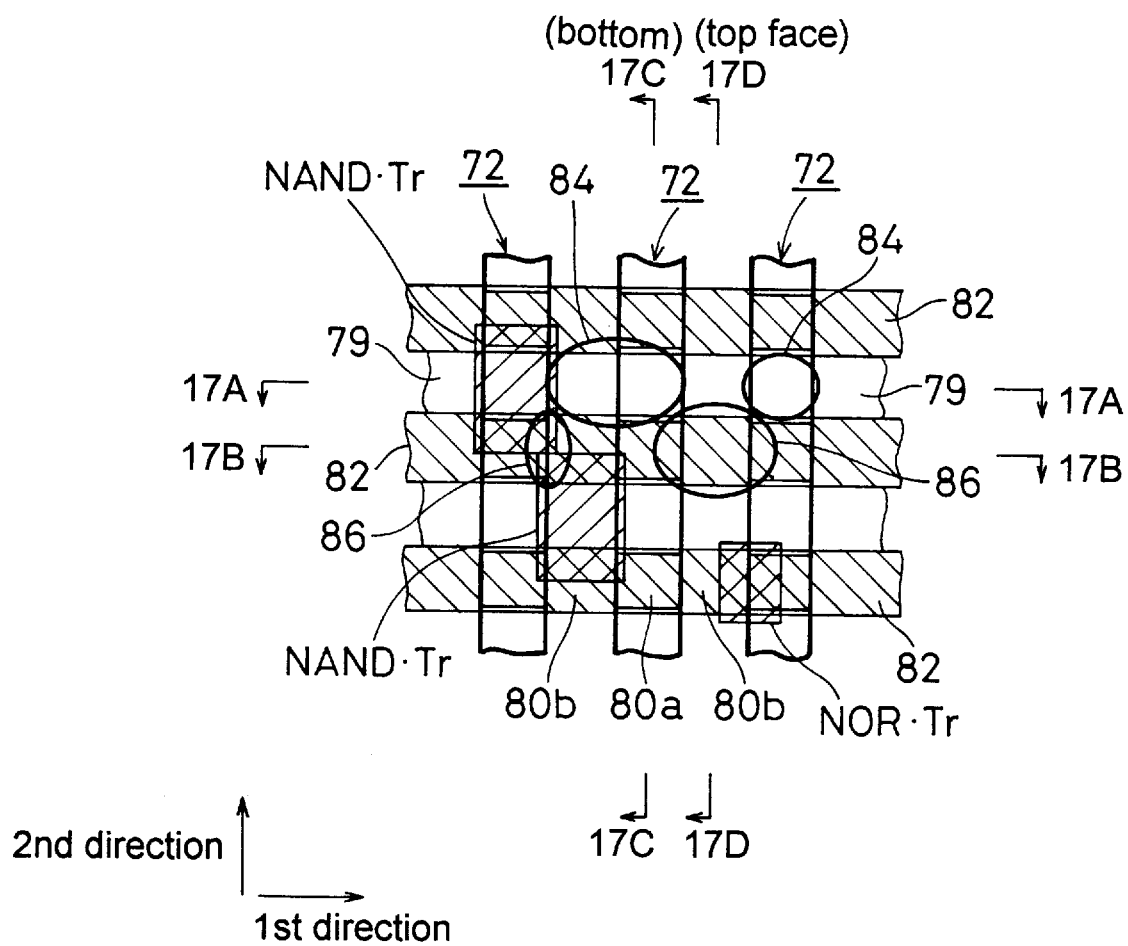
FIG. 16 is a plan view illustrating still another semiconductor device according to the present invention.
Figure 17A:
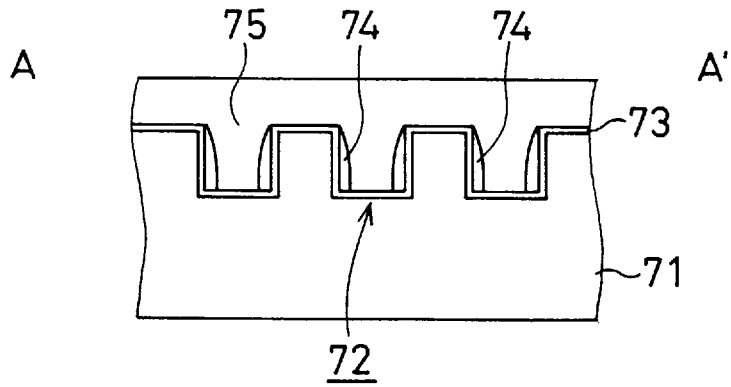
FIG. 17(a) to FIG. 17(d) are schematic sectional views taken along lines A–A', B–B', C–C' and D–D', respectively, in FIG. 16 for explaining a fabrication process for the semiconductor device.
Figure 17B:
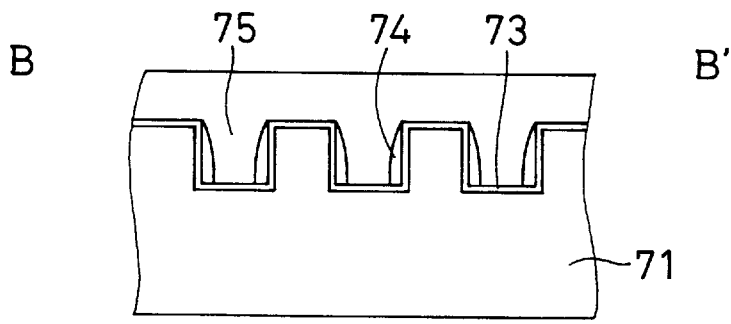
Figure 17C:
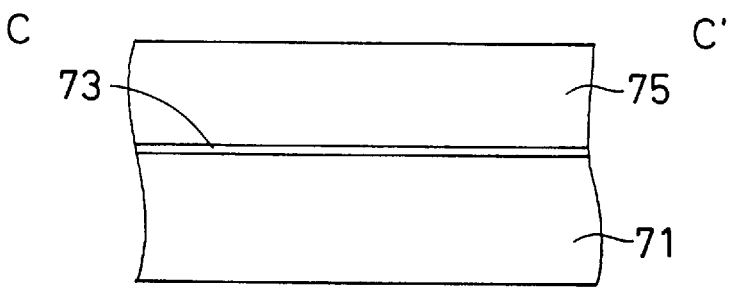
Figure 17D:
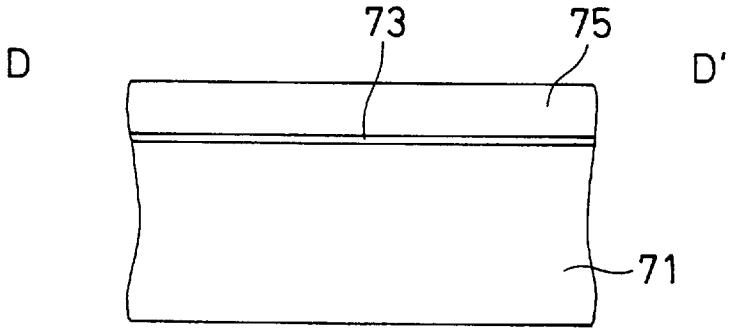
Figure 18A:
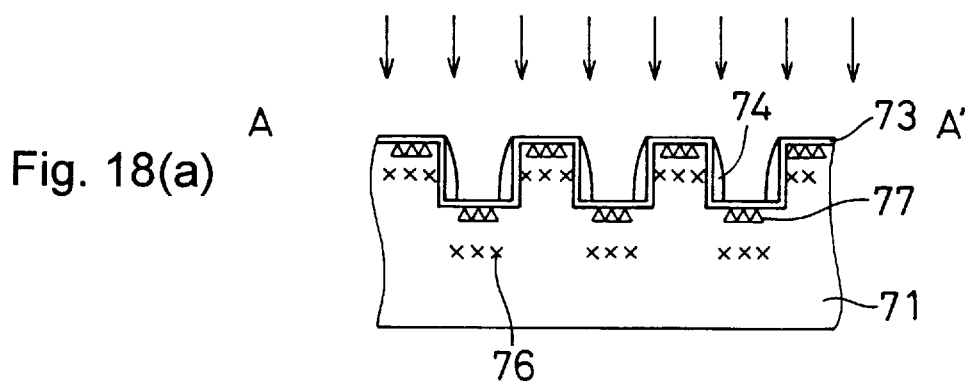
FIG. 18(a) to FIG. 18(d) are schematic sectional views taken along lines A–A', B–B', C–C' and D–D', respectively, in FIG. 16 for explaining the fabrication process.
Figure 18B:
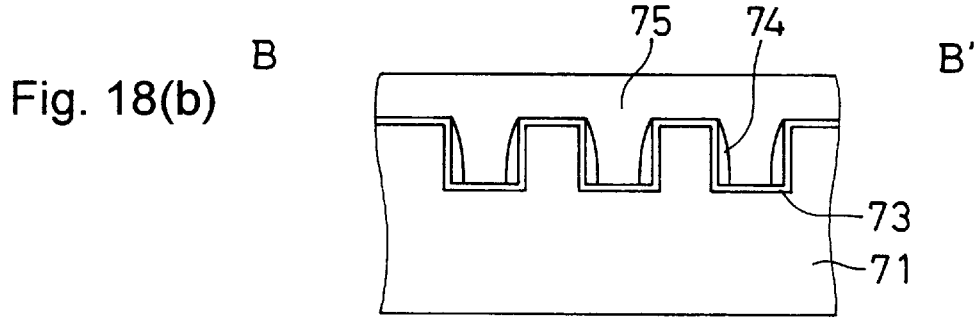
Figure 18C:
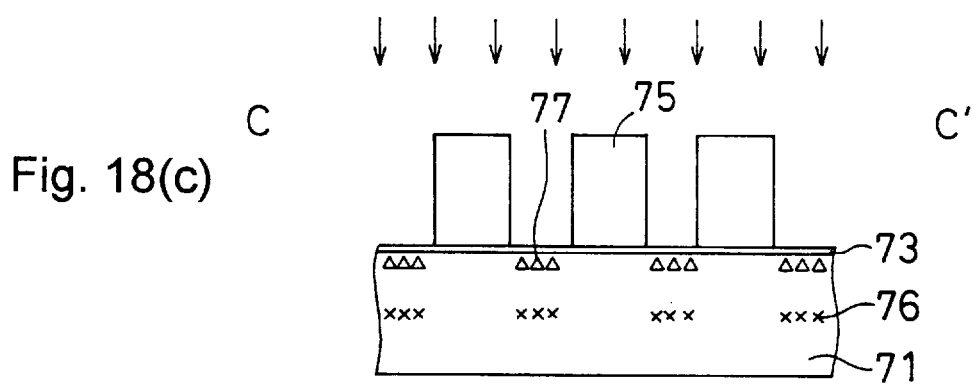
Figure 18D:
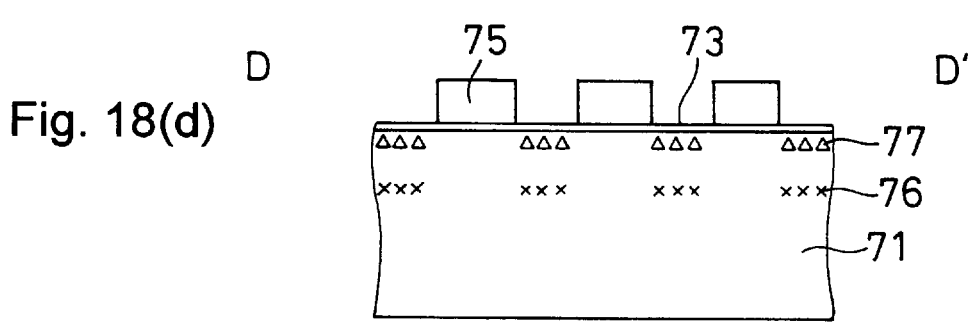
Figure 19A:
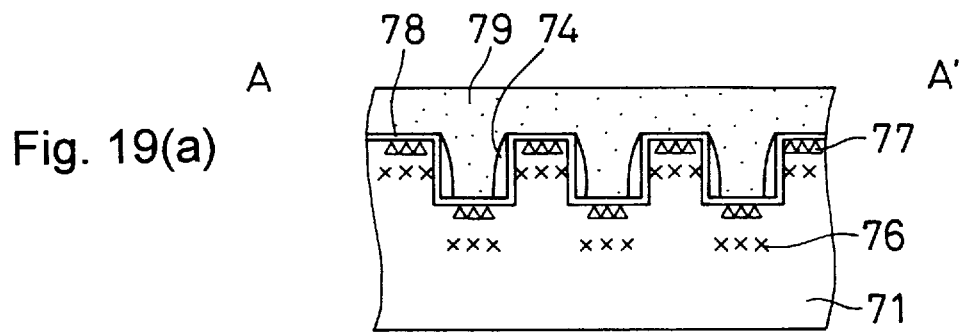
FIG. 19(a) to FIG. 19(d) are schematic sectional views taken along lines A–A', B–B', C–C' and D–D', respectively, in FIG. 16 for explaining the fabrication process.
Figure 19B:
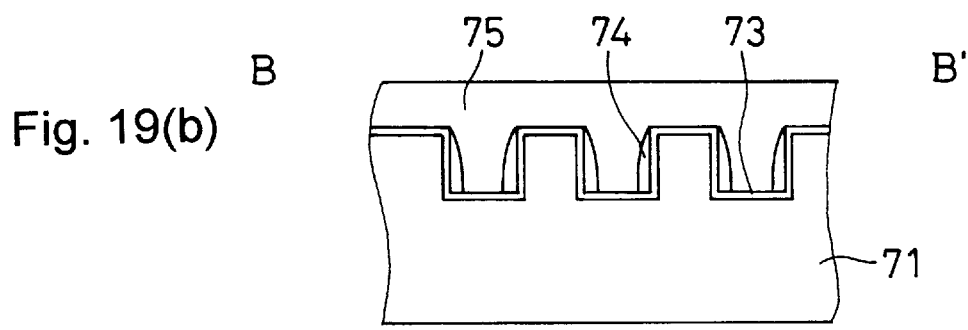
Figure 19C:
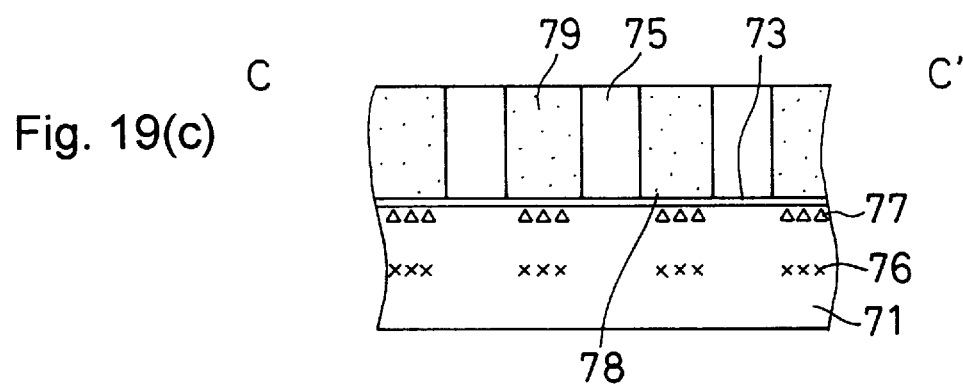
Figure 19D:
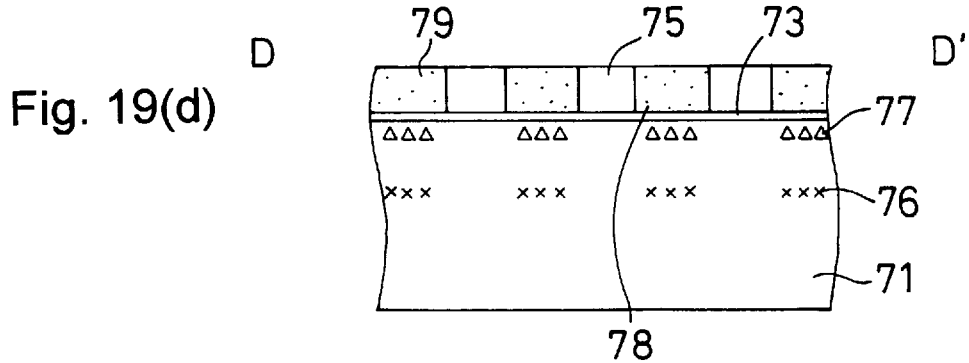
Figure 20A:
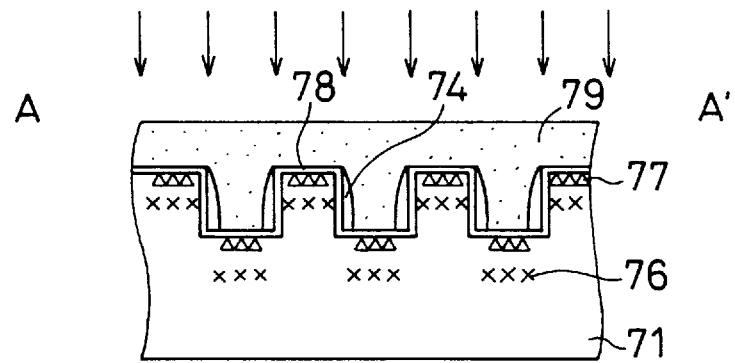
FIG. 20(a) to FIG. 20(d) are schematic sectional views taken along lines A–A', B–B', C–C' and D–D', respectively, in FIG. 16 for explaining the fabrication process.
Figure 20B:
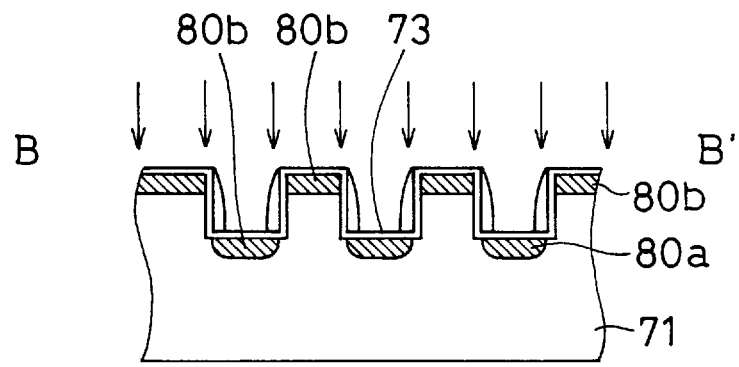
Figure 20C:
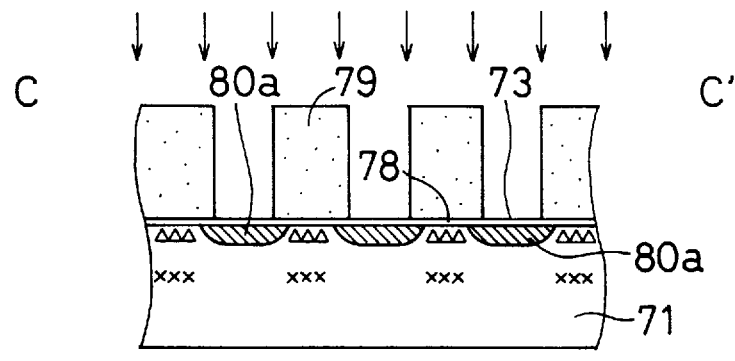
Figure 20D:
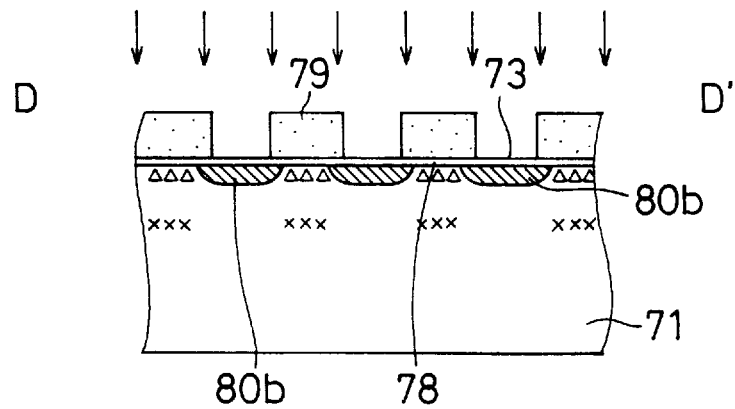
Figures 22A, 22B, 22C, 22D:
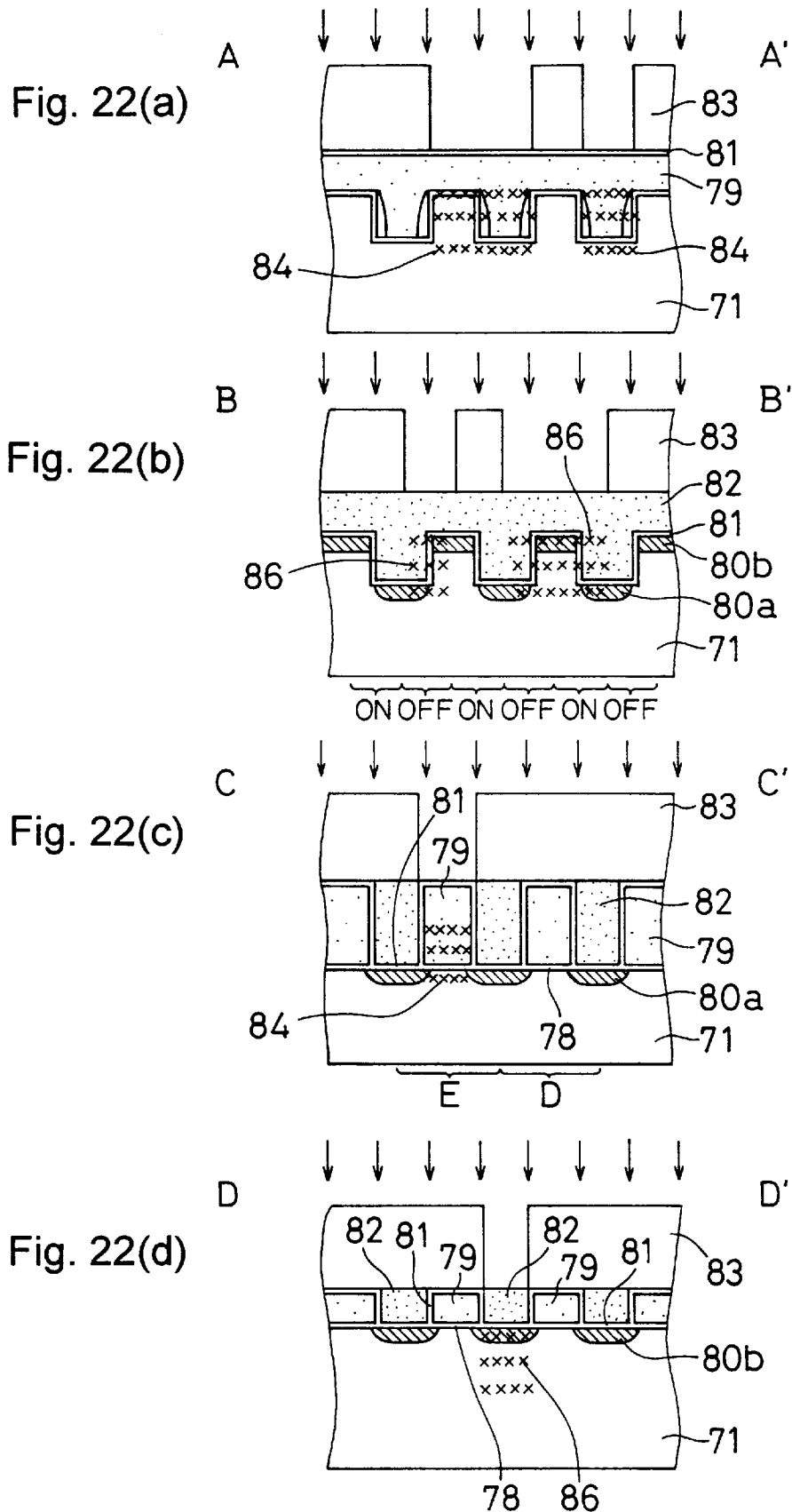
FIG. 22(a) to FIG. 22(d) are schematic sectional views taken along lines A–A', B–B', C–C' and D–D', respectively, in FIG. 16 for explaining the fabrication process.

Still another semiconductor device represented by the equivalent circuit diagram of FIG. 1 is shown in FIG. 16 and FIG. 21(a) to FIG. 21(d). FIG. 16 is a plan view thereof and FIG. 21(a), FIG. 21(b), FIG. 21(c) and FIG. 21(d) are sectional views taken along lines A–A', B–B', C–C' and D–D', respectively, in FIG. 16.

To further improve the integration level of the semiconductor device in comparison with Embodiment 1, a plurality of trenches 72 extending parallel to each other in a second direction are formed in a semiconductor substrate 71 as shown in FIG. 16 and FIG. 21(a) to FIG. 21(d). First transistors constituting NAND memory cells are formed, each comprising a first gate electrode 79 provided as a first word line on the semiconductor substrate 71 including the trenches 72 with intervention of a first gate insulating film 78 and source/drain regions 80a and 80b respectively formed in a trench bottom portion of the substrate 71 and in an upper surface portion of the substrate 71 between adjacent trenches 72. Second transistors constituting NOR memory cells are formed, each comprising a second gate electrode 82 formed as a second word line on source/drain regions 80a and 80b between adjacent first gate electrodes 79 with intervention of a second gate insulating film 81, a channel region formed in a trench sidewall portion of the substrate, and source/drain regions 80a and 80b which are shared with adjacent first transistors.

A process for fabricating the aforesaid semiconductor device will be described with reference to FIG. 17(a) to FIG. 17(d), FIG. 18(a) to FIG. 18(d), FIG. 19(a) to FIG. 19(d), FIG. 20(a) to FIG. 20(d), FIG. 21(a) to FIG. 21(d) and FIG. 22(a) to FIG. 22(d). FIG. 17(a) to FIG. 22(a), FIG. 17(b) to FIG. 22(b), FIG. 17(c) to FIG. 22(c) and FIG. 17(d) to FIG. 22(d) are sectional views taken along lines A–A', B–B', C–C' and D–D', respectively, in FIG. 16.

As shown in FIG. 17(a) to FIG. 17(d), the plurality of trenches 72 extending parallel to each other in the second direction are formed in the semiconductor substrate 71 by a known etching method. The trenches preferably each have a depth (e.g., about 0.5 μm) equivalent to a channel length of each second transistor of a NOR memory cell to be formed in the subsequent step. To control the threshold voltages of the first and second transistors, ions such as $B^+$ ions having the same conductivity type as the semiconductor substrate 71 are implanted into the semiconductor substrate 71 in a dose of about $3 \times 10^{12}$ $cm^{-2}$ at an implantation energy of 35 KeV by way of an oblique rotation implantation method employing a line normal to the top surface of the semiconductor substrate 71 as a rotation axis and an implantation angle of about 30° with respect to the top surface of the semiconductor substrate 71.

In turn, an oxide film 73 having a thickness of about 50 Å to about 300 Å is formed on the surface of the resulting semiconductor substrate 71 including the trenches 72. An SiN film (not shown) having a thickness of about 1000 Å is formed on the oxide film 73, and etched back to form SiN sidewall spacers 74 on side walls of the trenches 72. The SiN sidewall spacers 74 are used as device isolation films to isolate from the surface of the semiconductor substrate 71 the first gate electrodes of the transistors which are to be formed in the subsequent step.

Subsequently, a thin SiN film (not shown) which will later serve as an oxide-film etching stopper is formed on the entire surface of the resulting semiconductor substrate 71. Then, an oxide film 75 having a thickness of about 5,000 Å to about 10,000 Å is formed on the entire surface of the resulting semiconductor substrate 71 including the trenches 72. This step is preferably followed by a planarlization step such as of etching back or melting. An alternative planarlization method is to employ an oxide deposition process ensuring an improved surface flatness.

Thereafter, as shown in FIG. 18(a) to FIG. 18(d), portions of the oxide film 75 are removed from regions where the first gate electrodes are to be formed, by photolithographic and etching processes. At this time, the thin SiN (not shown) formed in the previous step is used as an etching stopper, which is thereafter removed. Ions such as boron ions having the same conductivity type as the semiconductor substrate 71 are implanted into the substrate 71 in a dose of $2 \times 10^{14}$ $cm^{-2}$ at an implantation energy of about 150 KeV for device isolation by using the resulting oxide film 75 as a mask. In turn, ions such as arcenic ions or phosphorus ions having a conductivity type different from that of the semiconductor substrate 71 are implanted into the substrate 71 in a dose of $5 \times 10^{13}$ $cm^{-2}$ at an implantation energy of about 40 KeV for transforming into the depletion type the first transistors of the NAND memory cells to be formed in the subsequent step.

In turn, some portions of the oxide film 73 are removed, and the first gate insulating films 78 are formed on regions where the first gate electrodes are to be formed as shown in FIG. 19(a) to FIG. 19(d). Polysilicon is deposited on the resulting substrate, and etched back to form the first gate electrodes 79 having a thickness of about 2,000 Å to about 7,000 Å (from a top face portion of the semiconductor substrate between adjacent trenches to a bottom of a trench). In accordance with this process, ion implantation for device isolation and for transformation of transistors into the depletion type can be performed in a self-alignment manner with respect to the first gate electrodes. It should be noted that an ordinary gate-electrode processing method may be used to simplify the process sequence.

Further, portions of the oxide films 75 present between the first gate electrodes 79 are removed. As shown in FIG. 20(a) to FIG. 20(d), ions having a conductivity type different from that of the semiconductor substrate 71 are implanted into the substrate 71 from a normal to the substrate 71 by using the first gate electrodes 79 and the SiN sidewall spacers 74 as a mask to form source/drain regions 80a and 80b in trench bottom portions of the substrate 71 and in upper surface portions of the substrate 71 between the trenches 72. For example, arsenic ions or phosphorus ions are implanted in a dose of $3 \times 10^{15}$ cm$^{-2}$ at an implantation energy of about 40 KeV. Thus, the first transistors constituting the NAND memory cells are formed, each comprising the first gate insulating film 78, a first gate electrode 79 and source/drain regions 80a or 80b.

In turn, as shown in FIG. 21(a) to FIG. 21(d), the SiN sidewall spacers 74 and the other portion of the oxide film 73 not covered with the first gate electrodes 79 are removed, and the second gate insulating film 81 having a thickness of about 50 Å to about 300 Å is formed on the entire surface of the resulting semiconductor substrate 71. Then, polysilicon is deposited on the second gate insulating film 81, and etched back to form the second gate electrodes 82 each having a thickness of about 2,000 Å to about 7,000 Å (from a top face portion of the substrate between adjacent trenches to a bottom of a trench). Thus, the second transistors constituting the NOR memory cells are formed, each comprising the second gate insulating film 81, a second gate electrode 82, source/drain regions 80a and 80b, and a channel region formed in a trench sidewall portion of the semiconductor substrate. Since the first gate electrodes 79 and the second gate electrodes 82 have the same end configurations as in Embodiment 1, these electrodes can be directly derived to gate electrodes of peripheral circuitry and interconnections for easy connection thereto.

In turn, ROM data are written in the NAND memory cells and the NOR memory cells simultaneously. As shown in FIG. 22(a) to FIG. 22(d), by using a resist pattern 83 having openings on regions 84 not intended for NAND ROM data writing and on regions 86 intended for NOR ROM data writing as a mask, boron (B$^+$) ions are implanted in a dose of about $2 \times 10^{14}$ cm$^{-2}$ three times at different implantation energies of about 100 KeV, about 180 KeV and about 300 KeV. In the ion implantation, only first transistors in the regions 84 not intended for the data writing are transformed into the E type, because ions having a conductivity type different from that of the semiconductor substrate are preliminary implanted into regions where the first transistors constituting the NAND memory cells are formed for rendering the first transistors into the depletion type. Since the ions to be implanted for the transformation of the first transistors into the enhancement type have the same conductivity type as the ions to be implanted for the NOR ROM data writing, the ion implantation can sequentially be performed using the same mask for the NOR ROM data writing (i.e., for setting the threshold voltages of desired second transistors higher than a supply voltage) and for the NAND ROM data writing. The ion implantation into selected first transistors each having a channel region in a trench bottom portion of the substrate 71 is performed at the highest energy, while the ion implantation into selected first transistors each having a channel region in an upper surface portion of the substrate 71 between adjacent trenches 72 is performed at the lowest energy. The ion implantation into selected second transistors each having a channel region in a trench sidewall portion of the substrate 71 is performed at an intermediate energy.

Alternatively, though the number of process steps and the number of masks to be used are increased, the ion implantation may be performed by using different masks for the ROM data writing to the first transistors having channel regions on the trench bottom portions of the substrate and for the ROM data writing to the first transistors having channel regions on the upper surface portions of the substrate between the trenches. In this case, the ion implantation for the data writing hardly influences adjacent cell transistors, so that a larger device margin can be provided. This arrangement is more advantageous for micronization of the semiconductor device.

The turnaround time of the semiconductor device fabrication can be shortened by performing the ROM data writing later in the process sequence. Therefore, the formation of an interlayer insulating film, a metal interconnections and the like may precede the data writing, like in Embodiment 1. In such a case, lighter boron ions, for example, may be implanted at a high implantation energy for the data writing. This method particularly shortens the turnaround time of the fabrication of a mask ROM.

Thereafter, the semiconductor device fabrication process is completed in the same manner as in Embodiment 1.

In Embodiment 3, the channel regions of the NOR memory cell transistors are formed in the trench sidewall portions, and the channel regions of the NAND memory cell transistors are formed in the trench bottom portions or the upper surface portions of the substrate. This arrangement is the contrary of Embodiment 2 in which the channel regions of the NAND memory cell transistors are formed in the trench sidewall portions of the substrate and the channel regions of the NOR memory cell transistors are formed in the trench bottom portions or the upper surface portions of the substrate. Therefore, multi-step ion implantation using different energies or rotation ion implantation has to be employed for ROM data writing to the NAND memory cells in Embodiment 2. In Embodiment 3, on the contrary, the ions are implanted from the upper side of the semiconductor substrate in an ordinary manner. Thus, the ion implantation can be readily and uniformly performed for the ROM data writing. This arrangement is also advantageous for the ion implantation for the device isolation.

Embodiment 4

The integration level of the semiconductor device of Embodiment 1 can be increased more than three times that of the conventional semiconductor device by selectively setting the threshold voltages of the second transistors of the NOR memory cells to multiple voltage levels. Where the thresholds of the second transistors of the NOR memory cells are selectively set to four levels, for example, the integration level is doubled or tripled in comparison with the semiconductor device of Embodiment 1.

The NOR ROM data writing is achieved by multi-step ion implantation employing different doses.

Embodiment 5

The integration levels of the semiconductor devices of Embodiments 2 and 3 can be increased more than six times that of the conventional semiconductor device by selectively setting the threshold voltages of the second transistors of the NOR memory cells to multiple voltage levels. Where the thresholds of the second transistors of the NOR memory cells are selectively set to four levels, for example, the integration level becomes four times to six times that of the semiconductor device of Embodiment 2 or 3.

The NOR ROM data writing is achieved by multi-step ion implantation employing different doses.

Embodiment 6

Figure 23:
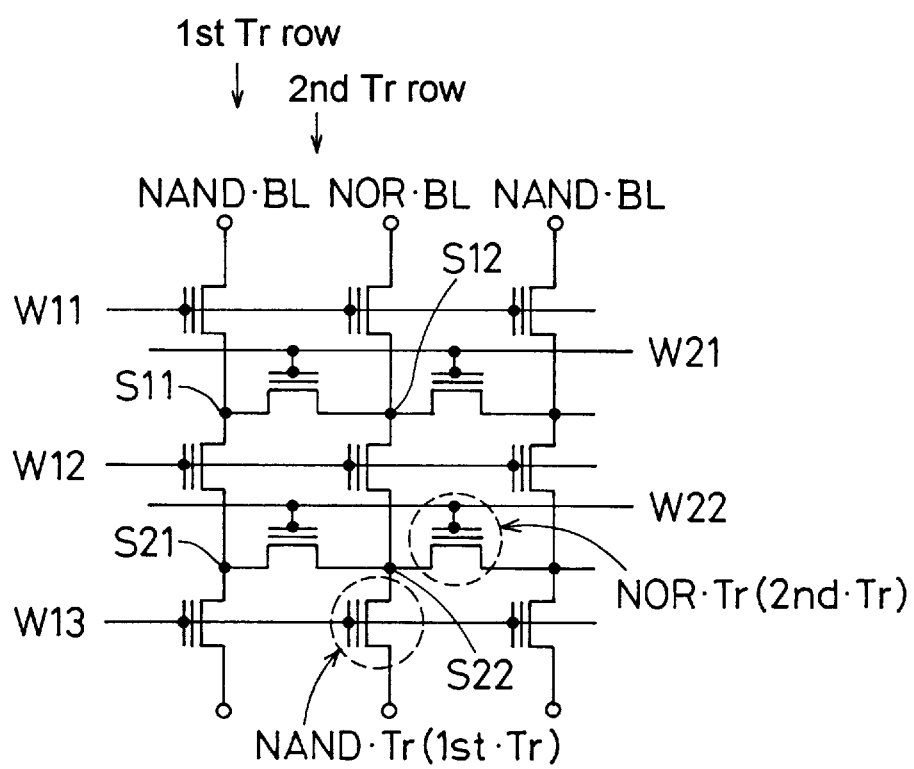
FIG. 23 is a plan view illustrating yet another semiconductor device according to the present invention.
Figure 24A:
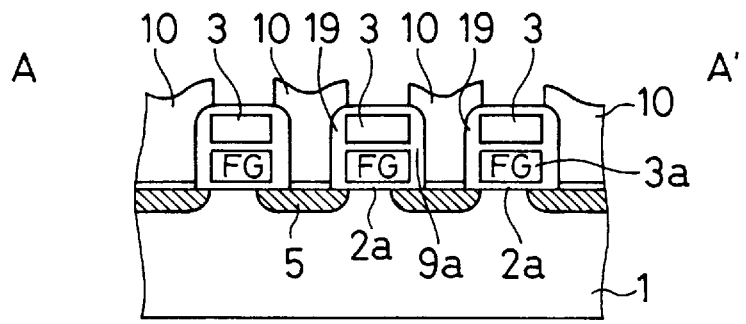
FIG. 24(a) to FIG. 24(d) are schematic sectional views taken along lines A–A', B–B', C–C' and D–D', respectively, in FIG. 23 for explaining a fabrication process for the semiconductor device.
Figure 24B:
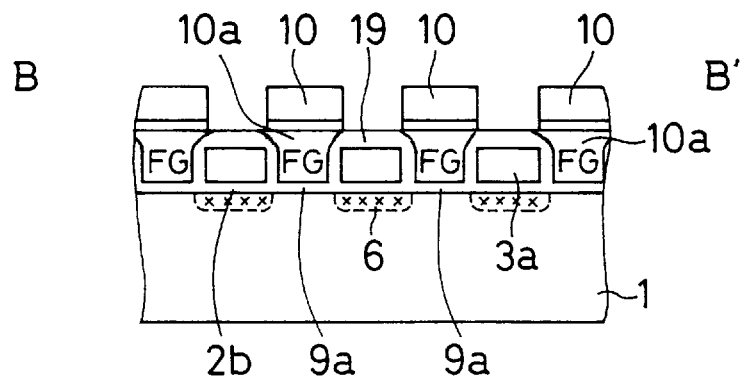
Figure 24C:
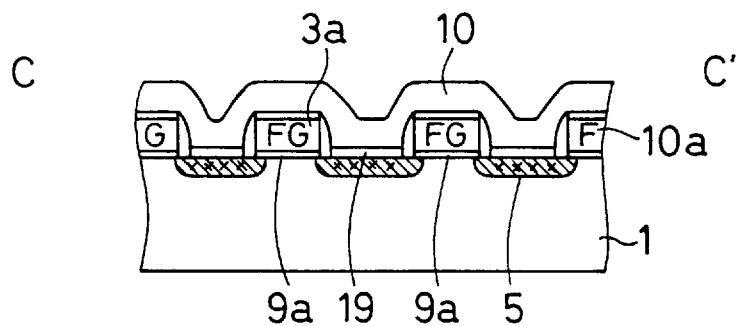
Figure 24D:
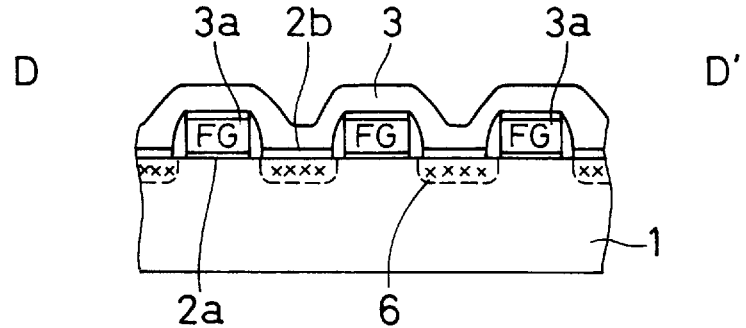
Figure 26A:
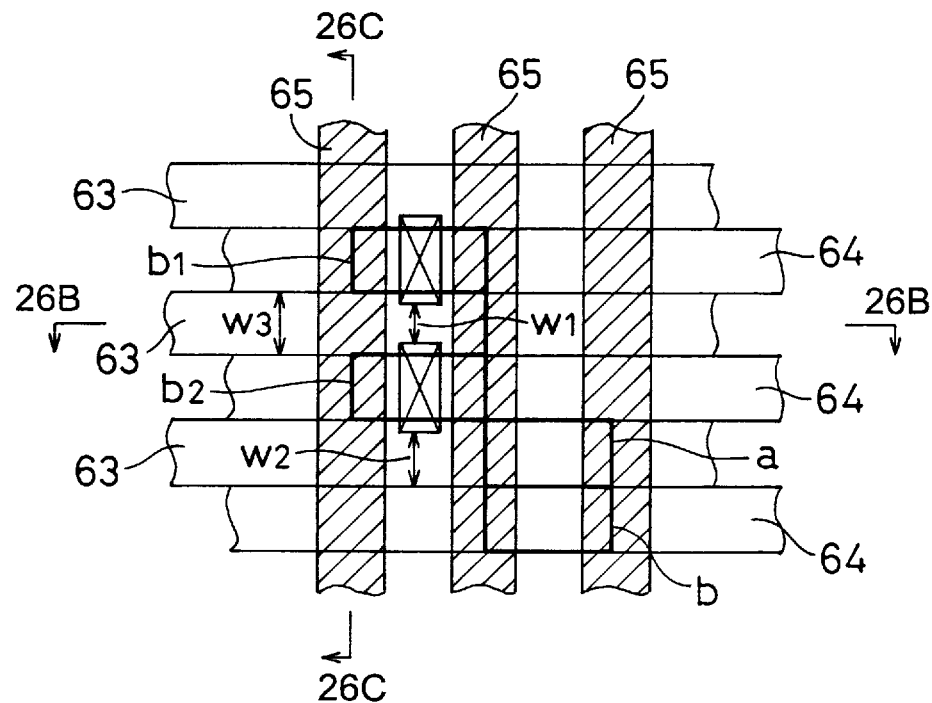
FIG. 26(a) is a plan view illustrating another conventional mask ROM cell.
Figure 26B:
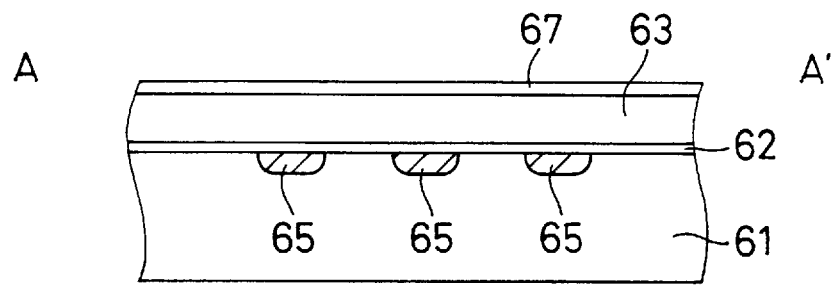
FIG. 26(b) and FIG. 26(c) are schematic sectional views taken along lines A–A' and B–B', respectively, in FIG. 26(a).
Figure 26C:
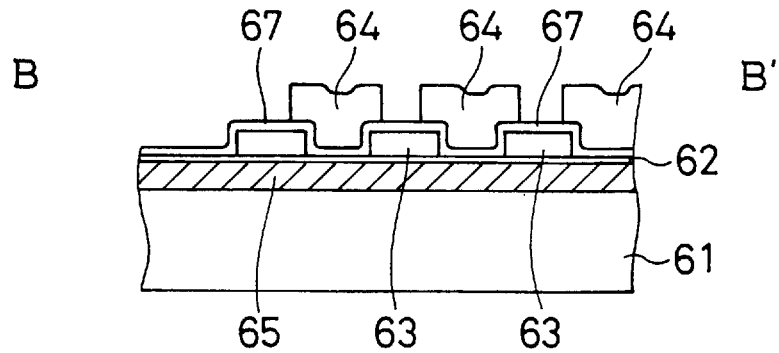

In accordance with Embodiment 6, a semiconductor device having the same transistor arrangement as shown in the mask ROM equivalent circuit diagram of FIG. 1 is constructed as a programmable ROM (other than the mask ROM) such that the first transistors constituting the NAND memory cells and the second transistors constituting the NOR memory cells each have a floating gate as shown in FIG. 23.

FIG. 24(a) to FIG. 24(d) are sectional views of the semiconductor device which correspond to the sectional views taken along lines A–A', B–B', C–C' and D–D', respectively, in FIG. 2. Referring to FIG. 24(a) to FIG. 24(d), the first transistors each have a floating gate 3a provided below a first gate electrode 3 and a tunnel oxide film 2a provided below the floating gate 3a, and the second transistors each have a floating gate 10a provided below a second gate electrode 10 and a tunnel oxide film 9a provided below the floating gate 10a. Oxide films 2b and 19 are formed in regions of the substrate 1 not formed with the floating gates 3a and 10a below the first gate electrode 3 and the second gate electrode 10, respectively.

In the programmable ROM, the threshold voltages of the respective transistors are controlled for data writing by selective hot electron implantation or selective tunnel electron implantation into the floating gates 3a and 10a. Data reading can be achieved in the same manner as in Embodiment 1.

In the first semiconductor device of the present invention, the second transistor rows are provided in spaces between the first transistor rows, and first transistors in each of the first transistor rows each share a source/drain region of a second transistor in a second transistor row. Thus, higher density integration can be realized.

In the second semiconductor device of the present invention, the second word lines are provided in spaces between the first word lines, and first transistors connected to each of the first word lines each share a source/drain region of a second transistor connected to a second word line. Thus, higher density integration can be realized.

Where the second semiconductor device includes the trenches formed in the semiconductor substrate, the first and second transistors can be formed in a three-dimensional configuration by utilizing the side walls of the trenches. Therefore, higher density integration can be realized without increasing the device area in plan.

The aforesaid semiconductor devices with a high integration level can be fabricated in accordance with the fabrication processes of the present invention. Since the fabrication processes are significantly simplified, the production cost can be reduced. At the same time, the performance of the semiconductor device can be improved.

In the fabrication processes according to the present invention, the masking step for ion implantation for data writing can be dispensed with or simplified, and the turn-around time can be shortened.

What is claimed is:

1. A semiconductor device comprising:

a plurality of first transistor rows each including a plurality of first transistors connected in series; and a plurality of second transistor rows provided between the first transistor rows and each including a plurality of second transistors;

wherein a source/drain region of one first transistor in one first transistor row is connected to a source/drain region of another first transistor in another first transistor row by a second transistor in the second transistor row.

2. A semiconductor device as set forth in claim 1, wherein said one first transistor in said one first transistor row is disposed adjacent to said another first transistor in said another first transistor row, and the second transistor connected to said one and another first transistors is disposed between said one first transistor row and said another first transistor row.

3. A semiconductor device as set forth in claim 1, wherein at least one of the first transistors and the second transistors are of floating gate type.

4. A semiconductor device comprising:

a plurality of first word lines disposed on a semiconductor substrate with intervention of a first gate insulating film and extending parallel to each other in a first direction;

a plurality of first transistors each having a gate electrode connected to a corresponding one of the first word lines;

a plurality of second word lines disposed between the first word lines with intervention of a second insulating film and extending in the first direction;

a plurality of second transistors each having a gate electrode connected to a corresponding one of the second word lines;

wherein the first transistors each share a source/drain region of an adjacent first transistor juxtaposed thereto in a second direction perpendicular to the first direction, and the second transistors each share a source/drain region of an adjacent second transistor juxtaposed thereto in the first direction; and source/drain regions of the first transistors are formed in the semiconductor substrate below the second word lines, and the first transistors each share a source/drain region of an adjacent second transistor.

5. A semiconductor device as set forth in claim 4, wherein the semiconductor substrate has a plurality of trenches extending parallel to each other in the first direction;

the first word lines are formed on side walls of the respective trenches and the second word lines are formed on top face portions of the semiconductor substrate between the trenches and on bottoms of the trenches.

6. A semiconductor device as set forth in claim 4, wherein the semiconductor substrate has a plurality of trenches extending parallel to each other in the first direction;

the second word lines are formed on the side walls of the respective trenches and the first word lines are formed on the top face portions of the semiconductor substrate between the trenches and on the bottoms of the trenches.

* * * * *